US012557689B2

(12) United States Patent
Chang et al.

(10) Patent No.: US 12,557,689 B2
(45) Date of Patent: Feb. 17, 2026

(54) PACKAGE STRUCTURE AND METHOD FOR FABRICATING THE SAME

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Tzu-Hsuan Chang, Taipei (TW); Rong-Teng Lin, New Taipei (TW); Bi-Xian Wu, New Taipei (TW); Teng-Chin Hsu, New Taipei (TW); Yun-Hong Yang, Kaohsiung (TW); Chien-Liang Chen, New Taipei (TW); Jam-Wem Lee, Hsinchu (TW); Kuo-Ji Chen, Hsinchu County (TW); Wun-Jie Lin, Hsinchu (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 367 days.

(21) Appl. No.: 18/451,989

(22) Filed: Aug. 18, 2023

(65) Prior Publication Data

US 2025/0062138 A1    Feb. 20, 2025

(51) Int. Cl.
| | |
|---|---|
| *H01L 21/56* | (2006.01) |
| *C08J 3/09* | (2006.01) |
| *C08K 3/04* | (2006.01) |
| *C08L 1/02* | (2006.01) |
| *H01L 23/00* | (2006.01) |

(Continued)

(52) U.S. Cl.
CPC .............. *H01L 21/565* (2013.01); *C08J 3/09* (2013.01); *C08K 3/042* (2017.05); *C08L 1/02* (2013.01); *H01L 23/295* (2013.01); *H01L 23/3135* (2013.01); *H01L 24/16* (2013.01); *H01L 25/105* (2013.01); *C08J 2300/00* (2013.01); *C08K 2201/001* (2013.01); *C08L 2203/206* (2013.01); *C08L 2205/16* (2013.01);
(Continued)

(58) Field of Classification Search
CPC . H01L 21/565; H01L 23/295; H01L 23/3135; H01L 24/16; H01L 25/105
See application file for complete search history.

(56) References Cited

U.S. PATENT DOCUMENTS

| 8,802,504 B1 | 8/2014 | Hou et al. |
| 8,803,292 B2 | 8/2014 | Chen et al. |

(Continued)

OTHER PUBLICATIONS

Pan et al., "Improved thermal conductivity and dielectric properties of hBN/PTFE composites via surface treatment by silane coupling agent", Composites Part B: Engineering, 2017, vol. 111, pp. 83-90.

(Continued)

*Primary Examiner* — Mark V Prenty
(74) *Attorney, Agent, or Firm* — Birch, Stewart, Kolasch & Birch, LLP

(57) ABSTRACT

A method for fabricating a package structure is provided. The method includes premixing cellulose nanofibrils (CNFs) and a graphene material in a solvent to form a solution; removing the solvent from the solution to form a composite filler; mixing a prepolymeric material with the composite filler to form a composite material; and performing a molding process using the composite material.

20 Claims, 21 Drawing Sheets

(51) Int. Cl.
  *H01L 23/29* (2006.01)
  *H01L 23/31* (2006.01)
  *H01L 25/10* (2006.01)

(52) U.S. Cl.
  CPC ............... *H01L 2224/16146* (2013.01); *H01L 2224/16225* (2013.01); *H01L 2924/182* (2013.01); *H01L 2924/186* (2013.01)

(56) References Cited

U.S. PATENT DOCUMENTS

| | | |
|---|---|---|
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2025/0062138 A1* | 2/2025 | Chang .................. H01L 25/105 |

OTHER PUBLICATIONS

Russo et al., "Thermal conductivity and dielectric properties of polypropylene-based hybrid compounds containing multiwalled carbon nanotubes", J. Appl. Polym. Sci., 2018, vol. 135, Issue 28, p. 46470 (1-9).

Su et al., "Improvement of mechanical and dielectrical properties of ethylene propylene diene monomer (EPDM)/barium titanate (BaTiO$_3$) by layered mica and graphite flakes", Composites Part B: Engineering, 2017, vol. 112, pp. 148-157.

* cited by examiner

PACKAGE STRUCTURE AND METHOD FOR FABRICATING THE SAME

BACKGROUND

Semiconductor devices are used in a variety of electronic applications, such as personal computers, cell phones, digital cameras, and other electronic equipment, as examples. Semiconductor devices are fabricated by sequentially depositing various insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These denser and smaller electronic components require more advanced packaging systems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 is a flow chart of a method for forming a composite material in a package structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease cost.

FIG. 1 is a flow chart of a method M for forming a composite material in a package structure according to some embodiments of the present disclosure. FIGS. 2A-2F illustrate the method M for forming the composite material in the package structure at various intermediate stages of manufacture according to some embodiments of the present disclosure. The method M may include steps S1-S8. At step S1, a graphite powder is provided. At step S2, the graphite powder is dispersed in a first solvent. At step S3, the first solvent is dried to leave graphene layers. At step S4, the graphene layers are dispersed in a second solvent to form a solution. At step S5, the solution including the graphene materials is premixed with cellulose nanofibrils (CNFs) in a third solvent. At step S6, the solution is dried to form a composite filler. At step S7, a polymeric material is compounded with the composite filler to form a composite material. At step S8, an injection molding process is performed with the composite material. It is understood that additional steps may be provided before, during, and after the steps S1-S8 shown by FIG. 1, and some of the steps described below can be replaced or eliminated for additional embodiments of the method. The order of the operations/processes may be interchangeable.

Figure 2A:
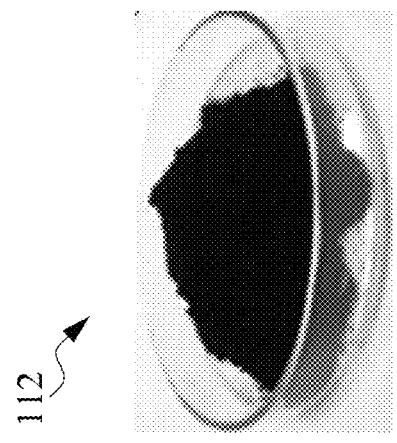
FIGS. 2A-2J illustrate a method for forming a composite material in a package structure at various intermediate stages of manufacture according to some embodiments of the present disclosure.

Reference is made to FIGS. 1 and 2A. The method M begins at step S1, where a graphite powder 112 is provided. Graphite may include several graphene layers. The graphene layers are held together by the weak Vander Waal attraction, in which this weak attraction between layers can ease the exfoliation into individual layers.

Figure 2B:
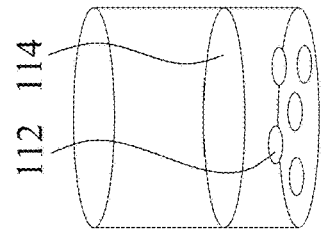

Reference is made to FIGS. 1 and 2B. The method M proceeds to step S2, the graphite powder 112 is dispersed in a first solvent 114. The graphite powder 112 can be exfoliated by different chemical methods in the liquid phase. Ultrasound and other technical means are used to embed the molecules of the first solvent 114 in the graphite sheet to achieve the exfoliation of graphite. The first solvent 114 may be an organic solvent. For example, the first solvent 114 may be dipolar aprotic solvents (e.g. Dimethylformamide (DMF), N-Methyl-2-Pyrrolidone (NMP)) or surfactants in aqueous solutions. The first solvent 114 may have a surface energy close to or match with the graphene surface energy, such that dispersing the graphite powder 112 in the first solvent 114 can overcome the van der Waals attractions forces between the adjacent graphene layers, thereby effectively to stabilizing graphene in solution without re-aggregation.

Figure 2C:
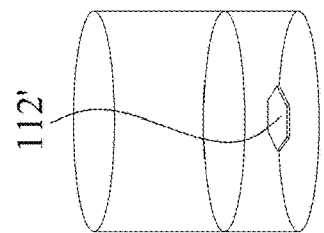

Reference is made to FIGS. 1 and 2C. The method M proceeds to step S3, the first solvent 114 is dried to leave graphene materials 112'.

Figure 2D:
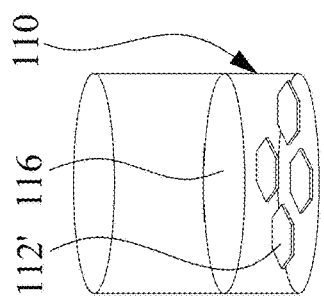
Figure 2D:
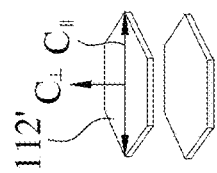

Reference is made to FIGS. 1 and 2D. The method M proceeds to step S4, the graphene materials 112' are dispersed in a second solvent 116 to form a solution 110. Ultrasound and other technical means are used to embed the molecules of the second solvent 116 between the graphene materials 112'. The second solvent 116 may include any suitable liquid capable of suspending the platelets of the graphene material 112' (and the CNFs 118 mentioned later). The second solvent 116 may be an organic solvent, and have a higher hydrophilicity than the first solvent 114 (referring to FIG. 2B). For example, the second solvent 116 may exemplarily be isopropanol (IPA). The steps S3 and S4 in combination may be referred to as a solvent replacement process, in which the first solvent 114 (referring to FIG. 2B) is replaced by the second solvent 116. After the solvent replacement process, a centrifugation process may be performed for obtaining well-dispersed graphene material 112'.

Each of the graphene materials 112' is a 2D material thin layer that may have a thickness of at least one atomic layer. Contrary to bulk materials, 2D material have a high surface-area-to-volume aspect ratio. For example, the graphene material 112' may include platelets (also referred to as flakes, nanosheets, or small flattened bodies) having a far smaller lateral dimension in a two-dimensional plane. In the present embodiments, the graphene material 112' may have a high thermal conductivity in its in-plane direction (e.g., the axis $C_{\parallel}$) and its out-of-plane direction (e.g., the axis $C_{\perp}$). In some embodiments, the graphene material 112' may show anisotropic thermal properties. For example, the in-plane thermal conductivity of the graphene material 112' may be higher than the out-of-plane thermal conductivity of the graphene material 112'. The graphene material 112' may also be referred to as 2D nanomaterial. In the context, "out-of-plane" may also be referred to as "through-plane." In some embodiments, the graphene material 112' may show anisotropic electrical properties. For example, the in-plane electrical conductivity of the graphene material 112' may be higher than the out-of-plane electrical conductivity of the graphene material 112'. The graphene material 112' includes honeycomb-dimensional crystals closed arranged in a two-dimensional plane by $sp^2$ hybridized carbon atoms. Each interlayer carbon atom bonds with the surrounding carbon atoms by $sp^2$ hybridization, and contributes a $\pi$ bond, to allow the electrons to move freely between the layers.

Figure 2G:
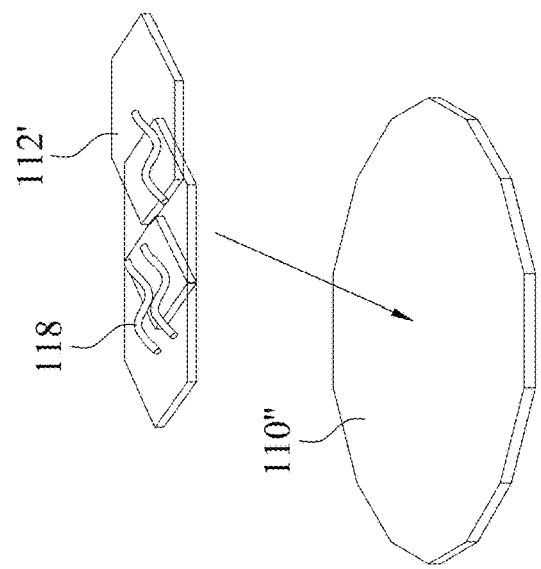
Figure 2F:
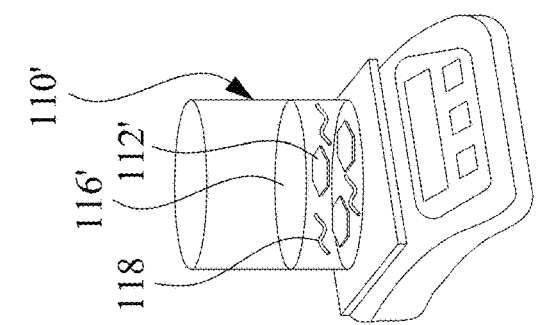
Figure 2E:
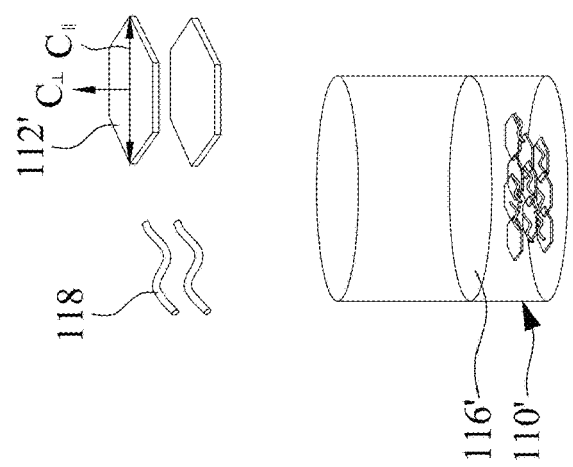

Reference is made to FIGS. 1 and 2E. The method M proceeds to step S5, where the solution 110 including the graphene materials 112' (referring to FIG. 2D) is premixed with CNFs 118 in a third solvent (e.g., deionized water). In illustrated embodiments, the premixing process includes a solution mixing step. The second solvent 116 (e.g., IPA) and the third solvent (e.g., deionized water) may be mixed and referred to as solvent 116'. After the premixing process, the CNFs 118, the graphene materials 112', and the solvent 116' in combination may be referred to as the solution 110'. In some embodiments, the graphene materials 112' and the CNFs 118 are premixed by a premixing ratio in a range from about 1:9 to about 9:1. For example, the graphene materials 112' and the CNFs 118 are premixed by a premixing ratio in a range from about 5:5 to about 9:1.

CNFs 118 may be natural or man-made 1D nanomaterials derived from celluloses that have a high length-to-width aspect ratio. For example, the CNFs 118 may include 1D nanostructures having an average length-to-width aspect ratio of at least 5:1. CNFs 118 may include for example: wood flour, wood fibers, sawdust, wood shavings, newsprint, paper, flax, hemp, grain hulls, kenaf, jute, sisal, nut shells or combinations thereof. In some other embodiments, other 1D nanomaterials or other nanofibrils having the high aspect ratio (e.g., carbon nanotubes and glass fibers) may also be applicable.

In some embodiments, the 1D nanomaterial may have one dimension (e.g., length) outside the nanoscale and other two dimensions in the nanoscale. The graphene material 112' is an 2D nanomaterial having two dimensions (e.g., length and width) outside the nanoscale and one dimension (e.g., thickness) in nanoscale. Thus, the 1D nanomaterial may have a higher length-to-width ratio than the graphene material 112'. For example, the 1D nanomaterial may have a length-to-width aspect ratio greater than 5, and the graphene material 112' may have a length-to-width aspect ratio in a range from 0.01 to 5.

Reference is made to FIGS. 1, 2F, and 2G. The method M proceeds to step S6, where the filtered solution 110' is dried to form a composite filler 110". The drying may involve evaporation of the solvent 116'. For example, in FIG. 2F, the evaporation of the solvent 116' may optionally include placing the container containing the filtered solution 110' on a heating station and heating the filtered solution 110'. By the drying (e.g., heating), the solvent 116' is removed from the solution 110', thereby forming the solid composite filler 110" in FIG. 2G. The composite filler 110" may be a composite film including the CNFs 118 and the graphene materials 112'.

Figure 2I:
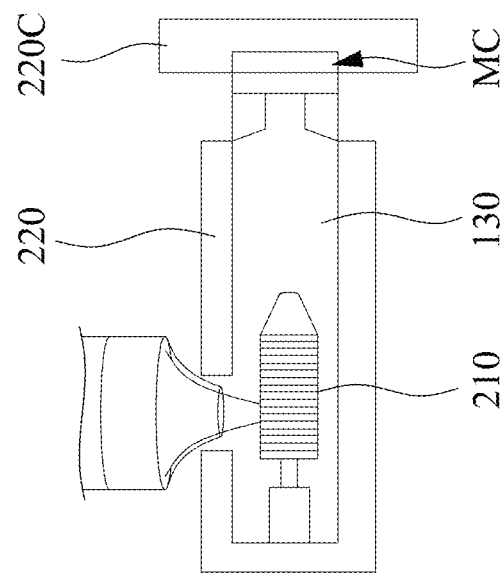
Figure 2H:
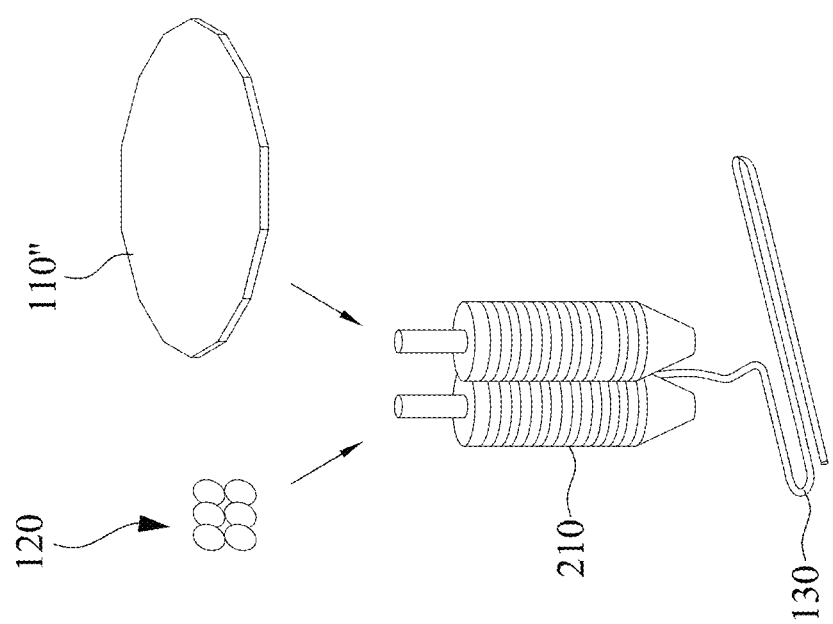

Reference is made to FIGS. 1 and 2H. The method M proceeds to step S7, where a prepolymeric material 120 is compounded with the composite filler 110" to form a composite material 130. The prepolymeric material 120 may include any prepolymer capable of serving as a molding compound, such as an epoxy, a resin, a moldable polymer, or the like. For example, the prepolymeric material 120 may include prepolymers of polypropylene (PP), polycarbonate, polyamide, polyethylene, or thermoplastic elastomer (TPE) or rubbers (e.g., thermoplastic polyurethane (TPU), thermoplastic polyolefin (TPO), and thermoplastic vulcanizate (TPV)). The prepolymer may include mixtures of reactive polymers with un-reacted monomers, and the prepolymer is capable of further polymerization by reactive groups to a fully cured, high molecular weight state. The prepolymeric material 120 may be applied while substantially liquid, and then may be cured through a chemical reaction, such as in an epoxy or resin. In other embodiments, the prepolymeric material 120 may be an ultraviolet (UV) or thermally curable prepolymer applied as a gel or malleable solid. In the context, the prepolymers and the prepolymeric material may also be referred to as a precursor or a polymeric precursor.

In some embodiments, in the compounding process, the composite filler 110" were first pulverized (i.e., broken into pieces) and then mixed with the prepolymeric material 120. In some embodiments, in the mixing step, the prepolymeric material 120 is substantially liquid, and the pulverized composite filler 110" possesses little or no viscoelastic characteristics is suspended in the prepolymeric material 120, thereby mixing the prepolymeric material 120 and the pulverized composite filler 110". The mixture may then be kneaded to form the composite material 130, for example, by use of a twin-screw compounder/extruder 210. In the illustrated embodiments, the compounding process may be a rotary compounding process using a rotary compounding machine including the twin-screw compounder/extruder 210. In some other embodiments, the prepolymeric material 120 and the composite filler 110" can be mixed by other compounding processes. In some embodiments, by deciding a suitable premixing ratio and good process parameter before rotary compound mixture process, the filler materials can disperse in composite homogeneously, and the excellent properties of the filler materials can be reserved with the well-constructed inner network.

Figure 2J:
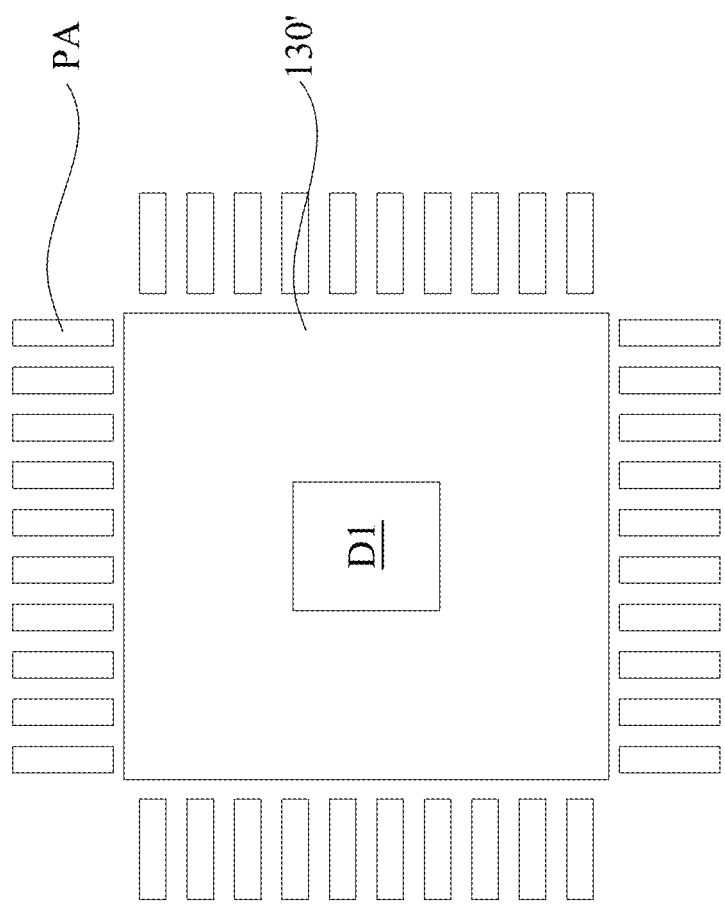

Reference is made to FIGS. 1 and 2I. The method M proceeds to step S8, where an injection molding process is performed with the composite material 130. In some embodiments, the composite material 130 is injected to a molding cavity MC of a chip carrier 220C for specific shapes by the use of a molding machine 220. The molding machine 220 can be an injection molding machine in some embodiments. Then, a curing process can be performed to harden the composite material 130 through a chemical/thermal reaction. After being hardened, the composite material 130 may be referred to as a composite material 130' as shown in FIG. 2J. FIG. 2J illustrate a cross-sectional view of a packaged structure including a die DI surrounded by the composite material 130'. Conducive pads PA are formed on four sides of the packaged structure. In some embodiments, the compounding machine and the molding machine used in the formation process of the composite material can be verified industry compatible.

Figure 3A:
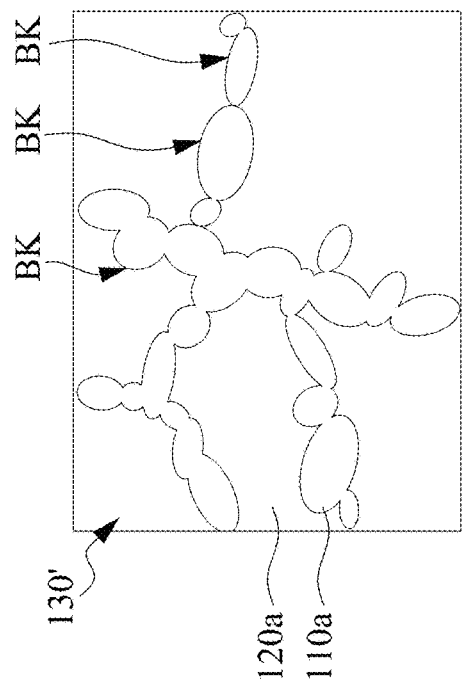
FIG. 3A is a schematic view of a composite material according to some embodiments of the present disclosure.
Figure 3B:
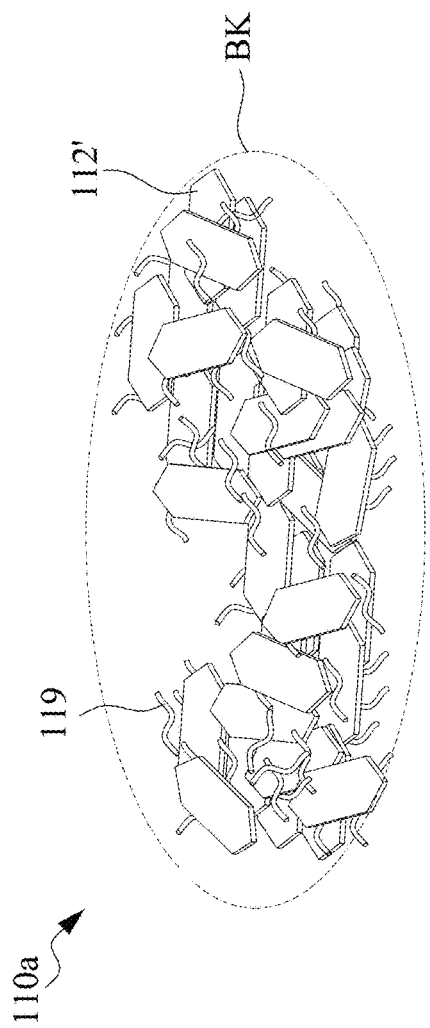
FIG. 3B is an enlarged schematic view of a network of the composite material of FIG. 3A.

FIG. 3A is a schematic view of a composite material 130' according to some embodiments of the present disclosure. FIG. 3B is an enlarged schematic view of the network 110a of the composite material 130' of FIG. 3A. Reference is made to FIGS. 3A and 3B. The composite material 130' may include a polymeric material 120a and a network 110a in the polymeric material 120a. The polymeric material 120a may include the same material as the prepolymeric material 120 (referring to FIG. 2H) does, and the network 110a may include the same material as the composite filler 110" (referring to FIG. 2H) does. The network 110a includes blocks BK of the CNFs 118 and platelets of the graphene materials 112'. The network 110a may show a continuous and long path in the composite material 130'. In some embodiments, the in-plane electrical conductivity and/or the out-of-plane electrical conductivity of the graphene material 112' is higher than the polymeric material 120a. In some embodiments, the in-plane thermal conductivity and/or the out-of-plane thermal conductivity of the graphene material 112' is higher than the polymeric material 120a.

CNFs 118 may interact with the platelets of the graphene materials 112', improve the homogeneous in-plane distribution (i.e., planar dispersion) of the platelets of the graphene materials 112' and make the platelets of the graphene materials 112' contact each other. In absence of the premixing process, in the compounding process, the CNFs and the platelets of the graphene materials 112' may be mixed and suspended in the polymeric material with low interaction, which forms short network 110a in the product.

In some embodiments of the present disclosure, by the premixing process, the interaction between the CNFs 118 and the platelets of the graphene materials 112' is strengthened before mixing the prepolymeric material 120 with the pulverized composite filler 110". For example, by the premixing process with a suitable mixing ratio before the compound process, blocks BK of aggregated CNFs 118 and graphene materials 112' are generated in the composite filler 110". When mixing the prepolymeric material 120 with the composite filler 110″, the blocks BK of aggregated CNFs 118 and graphene materials 112' can be effectively, uniformly, and homogeneously blended inside the prepolymeric material 120. The blocks BK may be in contact with each other, and thus form a network (or a long path) 110a in the composite material 130' after the curing process. The blocks BK may contain a few flakes to tens/hundreds flakes of graphene materials 112' in mostly plane stacking morphology. In some embodiments, the blocks BK may have a surface-to-volume aspect of at least 2:1 with respect to the unit thickness of the graphene materials. In some embodiments, the blocks BK are continuously connected to form the network 110a without any interruption. With the insertion of the network 110a, the good dispersion of graphene materials 112' can be realized.

The composite material 130' with the network may exhibit various functions, such as electrostatic discharge (ESD), electromagnetic shielding, and thermally conductivity. The weight ratio of the composite filler 110″ in the composite material 130' and the premixing weight ratio of the CNFs 118 and the graphene materials 112' may have different influences to these functions. Thus, for achieving better ESD and electromagnetic shielding, the ratio of the composite filler 110″ in the composite material 130' and the premixing ratio of the CNFs 118 and the graphene materials 112' are tuned without lowering the thermally conductivity too much.

Figure 4A:
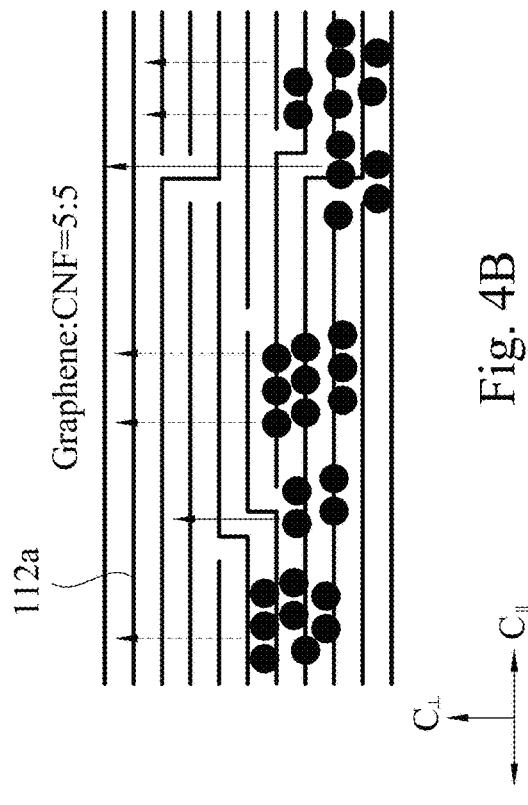
FIGS. 4A-4C illustrates schematic cross-sectional views showing the charges to conduct and jump in the graphene-based composite material with different premixing weight ratios of graphene materials and CNFs.
Figure 4B:
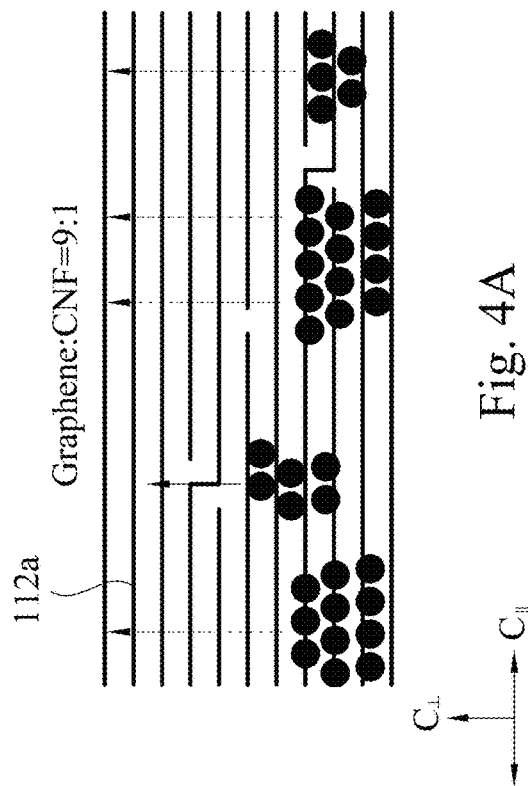
Figure 4C:
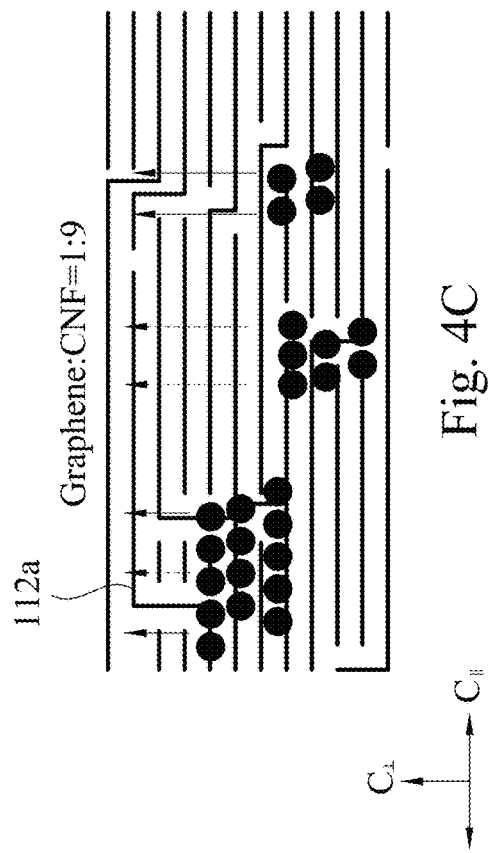

FIGS. 4A-4C illustrate schematic cross-sectional views showing the charges to conduct and jump in the graphene-based composite material 130' with different premixing weight ratios of the graphene materials 112' and the CNFs 118. Graphene materials 112' in the composites material 130' stacks layer by layer and indicated as graphene nanosheets 112a. The graphene nanosheets 112a may have vertical paths, allowing the charges to vertically conduct along the out-of-plane direction (e.g., the axis $C_\perp$), as indicated by the solid line arrows. Sometimes, the charges can jump over the gap between graphene nanosheets 112a along the out-of-plane direction (e.g., the axis $C_\perp$), as indicated by the dashed line arrows. In FIG. 4A, the graphene-based composite material 130' has a first premixing ratio of the graphene materials 112' and the CNFs 118. In FIG. 4B, the graphene-based composite material 130' has a second premixing ratio of the graphene materials 112' and the CNFs 118. In FIG. 4C, the graphene-based composite material 130' has a third premixing ratio of the graphene materials 112' and the CNFs 118. The first premixing ratio, the second premixing ratio, and the third premixing ratio decreases in a sequence. The higher premixing ratio of the graphene materials 112' and the CNFs 118 would lead to a substantially horizontal distribution of the graphene nanosheets 112a, which is beneficial for horizontal conduction along the in-plane direction (e.g., the axis $C_\parallel$). The lower premixing ratio of the graphene materials 112' and the CNFs 118 would lead to a substantially vertical distribution of the graphene nanosheets 112a, which is beneficial for vertical conduction along the out-of-plane direction (e.g., the axis $C_\perp$). To enhance electrostatic discharge (ESD) along both the in-plane direction (e.g., the axis $C_\parallel$) and the out-of-plane direction (e.g., the axis $C_\perp$), the premixing ratio can be adjusted such that the graphene materials 112' have adequate vertical and horizontal conduction paths. The charges from ESD events can jump over the gap between graphene nanosheets and further discharges by these vertical and horizontal paths provided by the graphene nanosheets. In some embodiments, by lowering the premixing ratio of the graphene materials 112' and the CNFs 118, the vertical paths is increased, thereby enhancing the ESD performance along the out-of-plane direction (e.g., the axis $C_\perp$).

In some embodiments, the premixing ratio of the graphene materials 112' and the CNFs 118 is designed to be in a range from about 5:5 to about 9:1, such as about 8:2. The premixing ratio is designed for disperse the graphene materials 112' in the composite material 130' in a homogeneous manner rather than an in-plane manner, which is beneficial for achieving functions of electrostatic discharge (ESD), thermal dissipation, and electromagnetic shielding. If the premixing ratio of the graphene materials 112' and the CNFs 118 is greater than about 9:1, the graphene materials 112' may be almost in-plane distributed in the composite material 130', and the composite material 130' may be switched to be electrically conductive when a small voltage bias (e.g., about 0.01V to about 0.5V) is applied, which in turn will result in that the composite material 130' may have serious current leakage issues at a small voltage bias, and may not serve as an electrical isolator between dies. If the premixing ratio of the graphene materials 112' and the CNFs 118 is less than about 5:5, the thermal conductivity of the composite material 130' is too low, and the composite material 130' may not dissipates heat well.

Figure 5B:
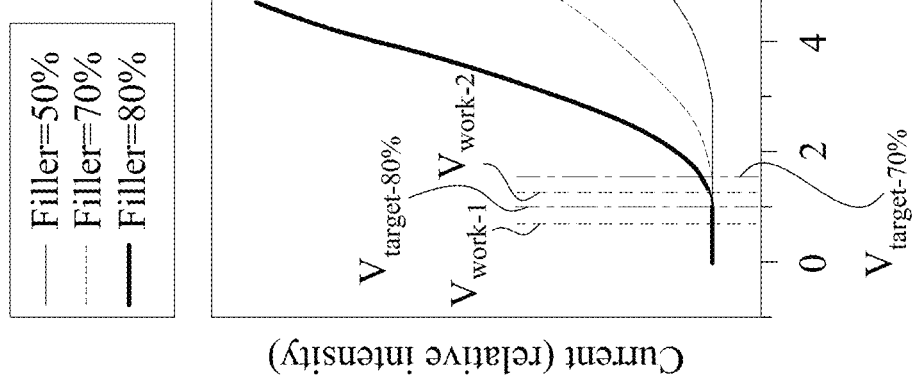
FIG. 5B is a graph illustrating voltages versus current under various filler weight ratios of graphene-based composite materials according to some embodiments of the present disclosure.
Figure 5A:
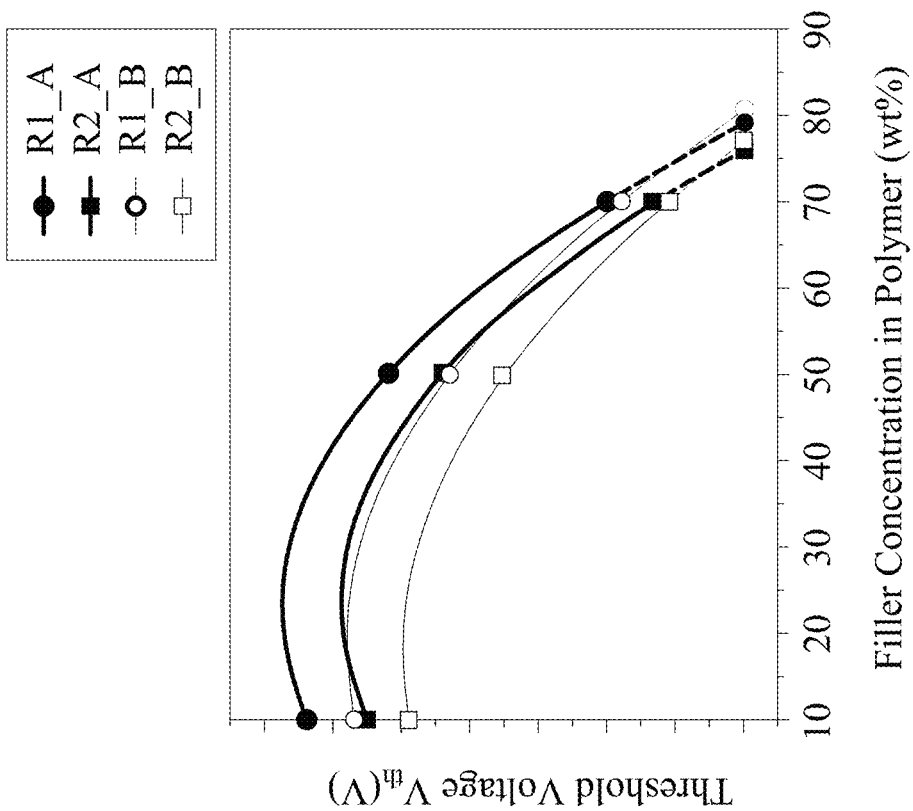
FIG. 5A is a graph illustrating threshold voltages versus filler weight ratio of graphene-based composite materials according to some embodiments of the present disclosure.

FIG. 5A is a graph illustrating threshold voltages ($V_{th}$) versus filler weight ratio of graphene-based composite materials 130' according to some embodiments of the present disclosure. In some examples, a premixing ratio of the graphene materials 112' and the CNFs 118 is designed at about 8:2. The horizontal axis represents filler weight ratios of the filler including the graphene materials 112' and the CNFs 118 in the graphene-based composite materials 130'. The vertical axis represents threshold voltages of composites/chip packaging materials. The curves R1_A and R2_A respectively indicate first and second measured results of the graphene-based composite materials 130' with metal formed by a first deposition method. The curves R1_B and R2_B respectively indicate first and second measured results of the graphene-based composite materials 130' with metal formed by a second deposition method.

The threshold voltage ($V_{th}$) of the graphene-based composite materials 130' can be tuned/engineered by controlling a filler weight ratio of the filler including the graphene materials 112' and the CNFs 118 in the graphene-based composite materials 130', thereby controlling a percentage of the graphene materials 112' in the graphene-based composite materials 130'. When a voltage greater than the threshold voltage ($V_{th}$) is applied on the graphene-based composite materials 130', the graphene-based composite materials 130' becomes electrically conductive, and can be used for ESD. When a voltage less than the threshold voltage ($V_{th}$) is applied on the graphene-based composite materials 130', the graphene-based composite materials 130' maintains as electrically insulated, can serve as encapsulant or fillers between chips/bumps in a package structure. As shown in FIG. 5A, when the filler weight ratio is less than about 85%, the graphene-based composite material 130' may serve as electrical isolator around the devices on the chips, and becomes electrical conductive for ESD when a voltage higher than the threshold voltage thereof is applied. When the filler weight ratio is greater than about 85%, the graphene-based composite material 130' may not be electrical isolator around the devices on the chips since the graphene-based composite material 130' may have serious current leakage issues due to the small $V_{th}$.

In some embodiments, the filler weight ratio of the filler including the graphene materials 112' and the CNFs 118 in the graphene-based composite materials 130' is controlled such that an operating/working voltage of the device is slightly below a threshold voltage ($V_{th}$) of the composites/chip packaging materials. FIG. 5B is a graph illustrating voltages versus current under various filler weight ratios of graphene-based composite materials (e.g., 50%, 70%, and 80%) according to some embodiments of the present disclosure. The graphene-based composite materials 130' with filler weight ratios of 50%, 70%, and 80% are shown. A threshold voltage of the graphene-based composite materials 130' with the filler weight ratio of about 70% is indicated as a threshold voltage $V_{target-70\%}$. A threshold voltage of the graphene-based composite materials 130' with the filler weight ratio of about 80% is indicated as a threshold voltage $V_{target-80\%}$. A first device operating at an operating/working voltage $V_{work-1}$ may use the graphene-based composite materials 130' with the filler weight ratio of about 80% as its encapsulant, such that the encapsulant can provide ESD to the first device since the operating/working voltage $V_{work-1}$ is slightly below the threshold voltage $V_{target-80\%}$. A second device operating at an operating/working $V_{work-2}$ may use the graphene-based composite materials 130' with the filler weight ratio of about 70% as its encapsulant, such that the encapsulant can provide ESD to the second device since the operating/working voltage $V_{work-2}$ is slightly below the threshold voltage $V_{target-70\%}$. The operating/working voltage of the devices (e.g., the operating/working voltages $V_{work-1}$ and $V_{work-2}$) may be in a range from about 0.6 Volts to about 1200 Volts, and the threshold voltages of the graphene-based composite materials 130' (e.g., the threshold voltages $V_{target-70\%}$ and $V_{target-80\%}$) may be designed to be in a range from about 2 Volts to about 1400 Volts, for serving as an encapsulant. In some embodiments, the threshold voltages of the graphene-based composite materials 130' may be designed to be higher than the operating voltage of the devices by a value in a range from about 1.4 Volts to about 200 Volts. In some embodiments where a low power device is used, the threshold voltages of the graphene-based composite materials 130' may be designed to be higher than the operating voltage of the devices by a value in a range from about 1.4 Volts to about 1.6 Volts. In some embodiments where a high power device is used, the threshold voltages of the graphene-based composite materials 130' may be designed to be higher than the operating voltage of the devices by a value in a range from about 150 Volts to about 200 Volt. If the difference between the threshold voltages of the graphene-based composite materials 130' and the operating voltage of the devices is too less, the graphene-based composite materials 130' may result in leakage when the devices operate. If the difference between the threshold voltages of the graphene-based composite materials 130' and the operating voltage of the devices is too large, the graphene-based composite materials 130' may not provide ESD to the devices.

Figure 6:
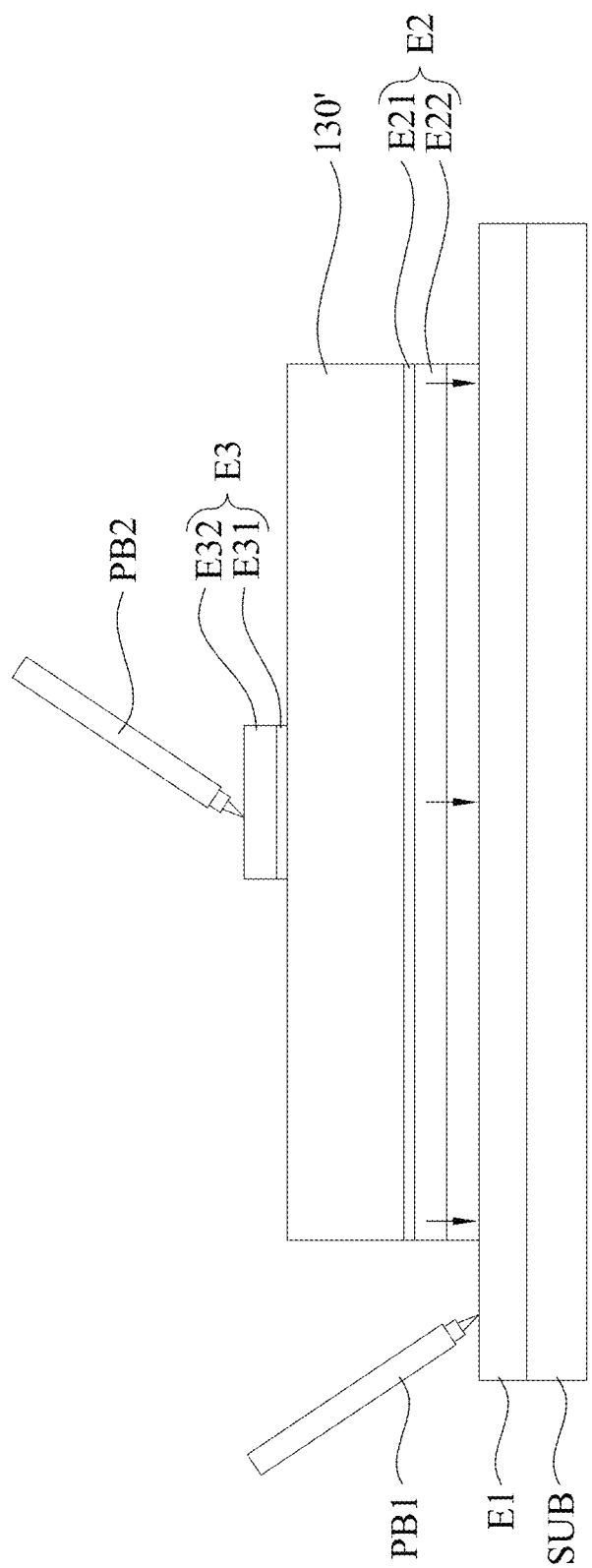
FIG. 6 is a schematic cross-sectional view of a graphene-based composite material under test according to some embodiments of the present disclosure.

FIG. 6 is a schematic cross-sectional view of a graphene-based composite material 130' under test according to some embodiments of the present disclosure. An electrode E1 is formed over a substrate SUB, and electrodes E2 and E3 are respectively formed over a bottom and a top of the composite material 130'. Probes PB1 and PB2 are respectively connected to the electrodes E1 and E3. The electrode E1 may include an Au layer, the electrode E2 may include a Ti layer E21 and an Au layer E22, and the electrode E3 may include a Ti layer E31 and an Au layer E32. By pressing the graphene-based composite material 130' downward, the electrode E2 may be in contact with the electrode E1, such that the probes PB1 and PB2 may provide current/voltage to the graphene-based composite material 130' and record the transient pulses.

Figure 7B:
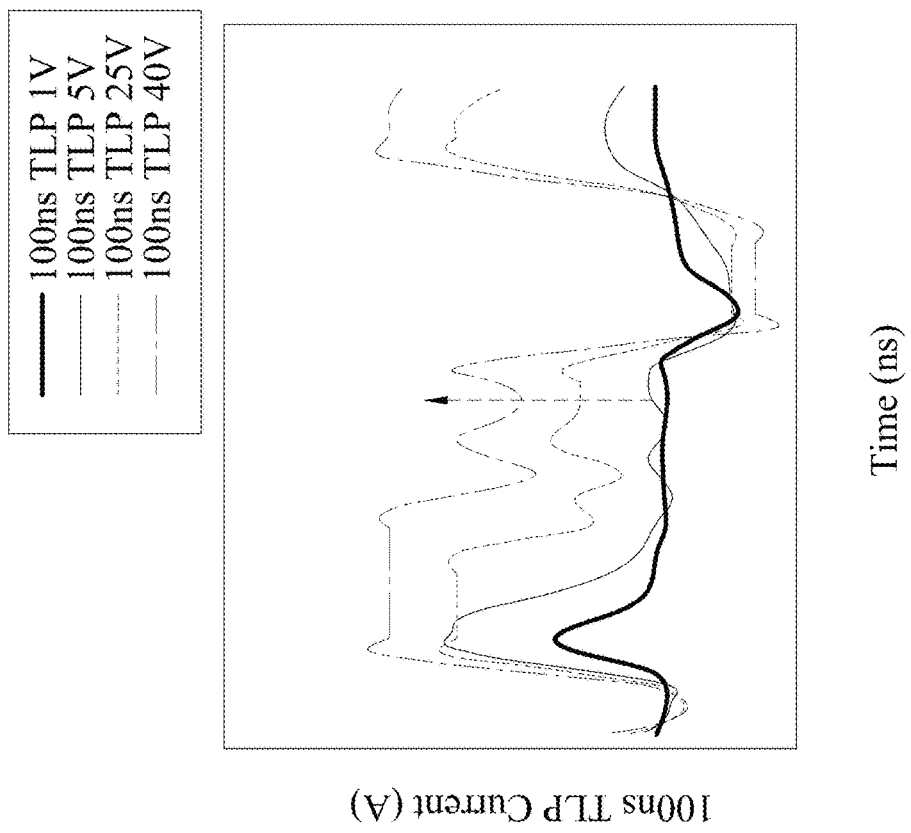
FIG. 7B is a graph illustrating TLP current versus time under TLP measurements using various voltage amplitudes according to some embodiments of the present disclosure.
Figure 7A:
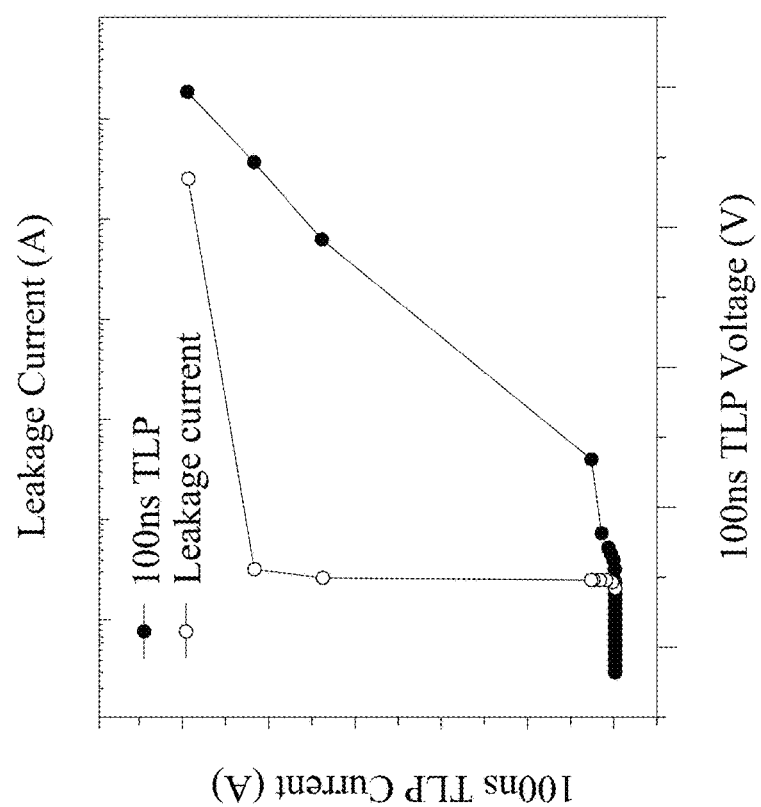
FIG. 7A is a graph illustrating Transmission line pulse (TLP) currents, TLP voltages, and leakage currents under a TLP measurement according to some embodiments of the present disclosure.

FIG. 7A is a graph illustrating Transmission line pulse (TLP) currents, TLP voltages, and leakage currents under a TLP measurement according to some embodiments of the present disclosure. The TLP measurement uses short pulses with a width on the order of nanoseconds, making it possible to obtain I-V characteristics in the high-voltage, high-current region (i.e., ESD voltage/current region) without causing thermal destruction. For example, pulses with a width of 100 ns and a variable voltage amplitude is used. In FIG. 7A, the vertical axis represents TLP currents, the bottom horizontal axis represents the TLP voltages, and the top horizontal axis represents the leakage currents.

FIG. 7B is a graph illustrating TLP current versus time under TLP measurements using various voltage amplitudes according to some embodiments of the present disclosure. For example, a TLP measurement using pulses with a width of 100 ns and 1V amplitude is denoted as 100 ns TLP 1V. A TLP measurement using pulses with a width of 100 ns and 5V amplitude is denoted as 100 ns TLP 5V. A TLP measurement using pulses with a width of 100 ns and 25V amplitude is denoted as 100 ns TLP 25V. A TLP measurement using pulses with a width of 100 ns and 40V amplitude is denoted as 100 ns TLP 40V. In FIG. 7B, the vertical axis represents TLP currents, and the horizontal axis represents time. In FIG. 7B, an arrow is shown for indicating a time point with a turn-on transition. The I-V characteristics in FIG. 7A may be obtained at least from TLP currents at this the time point.

With reference to FIGS. 7A and 7B, when the small voltage pulse (e.g., below a threshold voltage) is suddenly provided to the graphene-based composite material 130', it will charge like a capacitor, and no charge dispersion. If a large pulse voltage (e.g., above a threshold voltage) is provided to the graphene-based composite material 130', it will act like a low electrical resistance allowing discharge, and excessive charge will be dispersed quickly. From FIG. 7B, it can be observed that the charge can be dispersed at an ultra-high reaction speed, for example, within a few of nanoseconds, which is beneficial for protecting IC devices. Thus, the graphene-based composite material 130' can further protect IC from electrostatic discharge. Stated differently, the conductivity of the graphene-based composite material 130' is tunable that can be designed to be a OFF mode (capacitor-like mode) and a ON mode (low resistance-like mode) upon the operating voltage of the integrated circuit. That is, the graphene-based composite material 130' has a first resistance (e.g., OFF mode) under a first voltage and a second resistance (e.g., ON mode) under a second voltage, wherein the second voltage is greater than the first voltage, and the second resistance is less than the first resistance. The graphene-based composite material 130' can protect the integrated circuit from the electrostatic discharge in low power consumption.

Figure 8B:
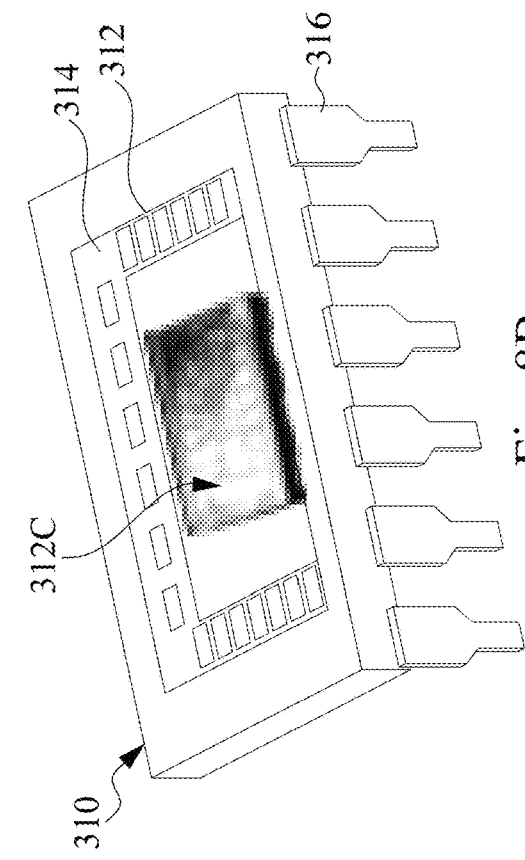
FIGS. 8A-8E illustrate a method for forming a package die at various intermediate stages of manufacture according to some embodiments of the present disclosure.
Figure 8A:
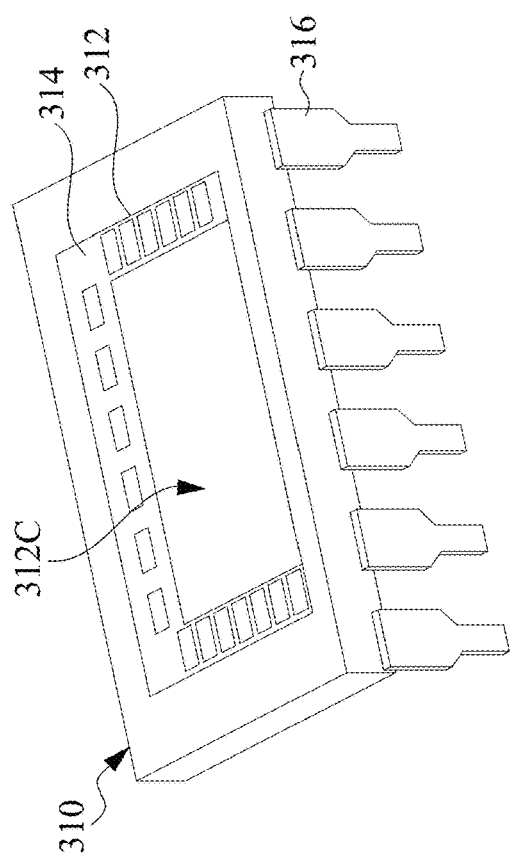
Figure 8C:
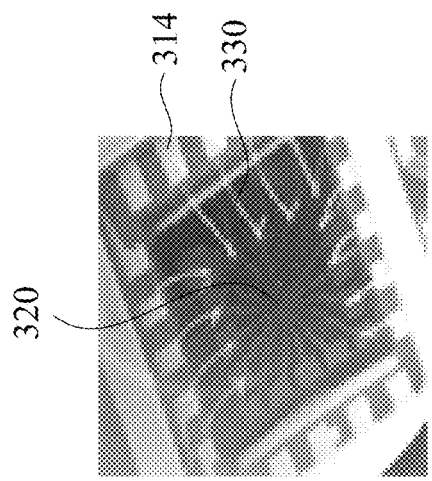
Figure 8E:
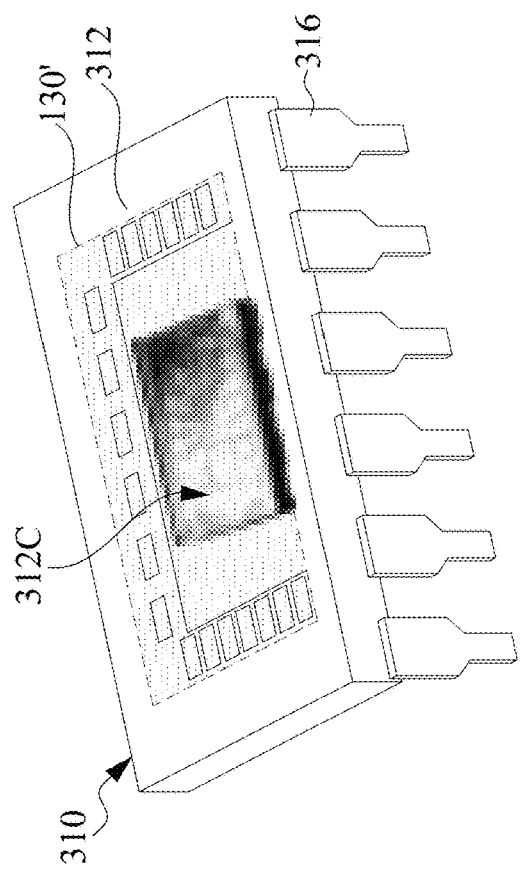
Figure 8D:
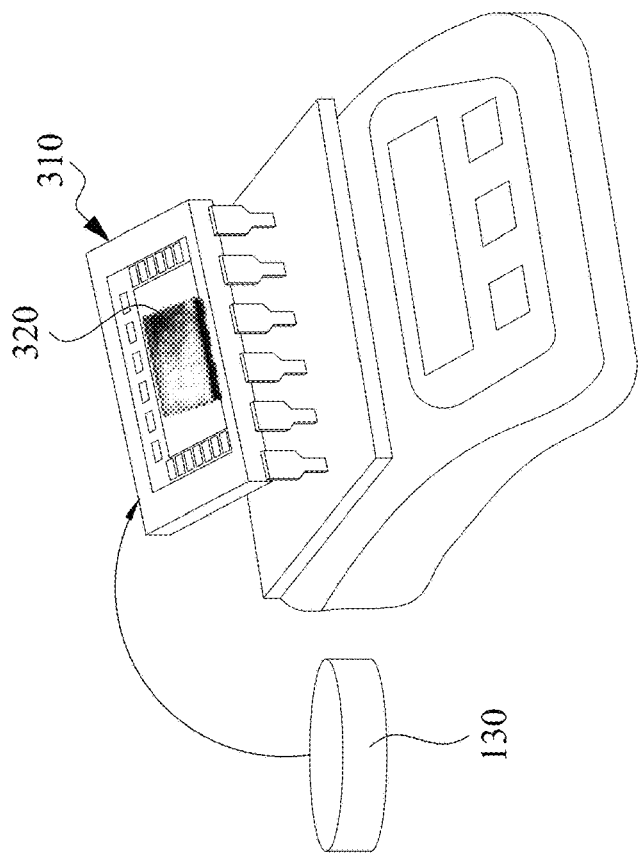

FIGS. 8A-8E illustrate a method for forming a package die at various intermediate stages of manufacture according to some embodiments of the present disclosure. It is understood that additional steps may be provided before, during, and after the steps shown by FIGS. 8A-8E, and some of the steps described below can be replaced or eliminated for additional embodiments of the method. The order of the operations/processes may be interchangeable. In FIG. 8A, a ceramic chip carrier 310 is provided. The ceramic chip carrier 310 include a ceramic body 312 having a cavity 312C, plural conducive pads 314, and pins 316. The conducive pads 314 are electrically connected to the pins 316 by wires embedded the ceramic body 312. In FIG. 8B, a chip/die 320 is placed in the cavity 312C of the ceramic body 312. In FIG. 8C, a wire bonding technique is performed to bond the chip/die 320 to the conducive pads 314 by wires 330. In FIG. 8D, the composite material 130 fills the space in the cavity 312C of the ceramic body 312 and surrounds the chip/die 320, and a heating process is performed to cure the composite material 130. After the heating process, the composite material 130 becomes a composite material 130' as illustrated in FIG. 8E. The graphene-based composite material 130' is formed at a top side of the die 320, such that the die 320 is encapsulated by the ceramic body 312 and the graphene-based composite material 130'.

Figure 9B:
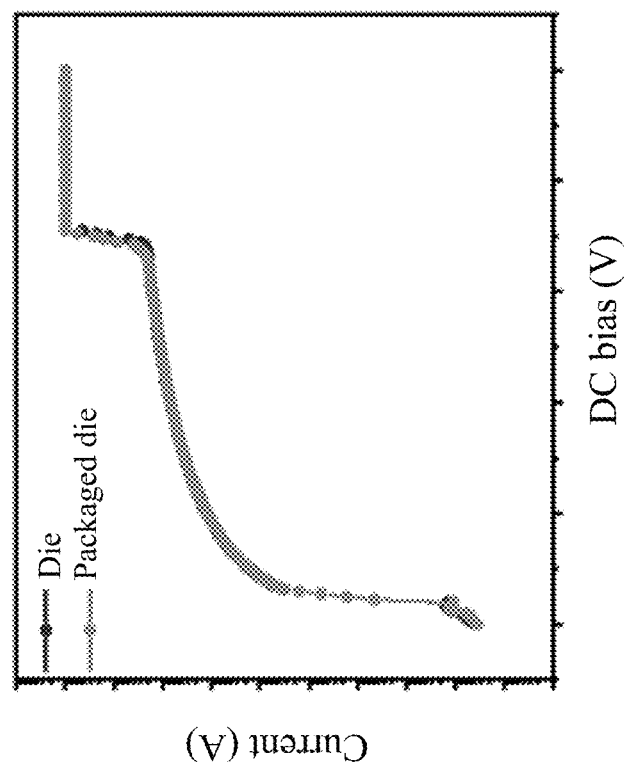
FIG. 9B show I-V curves of the bare die and the packaged die of FIG. 8E with current in log scale according to some embodiments of the present disclosure.
Figure 9A:
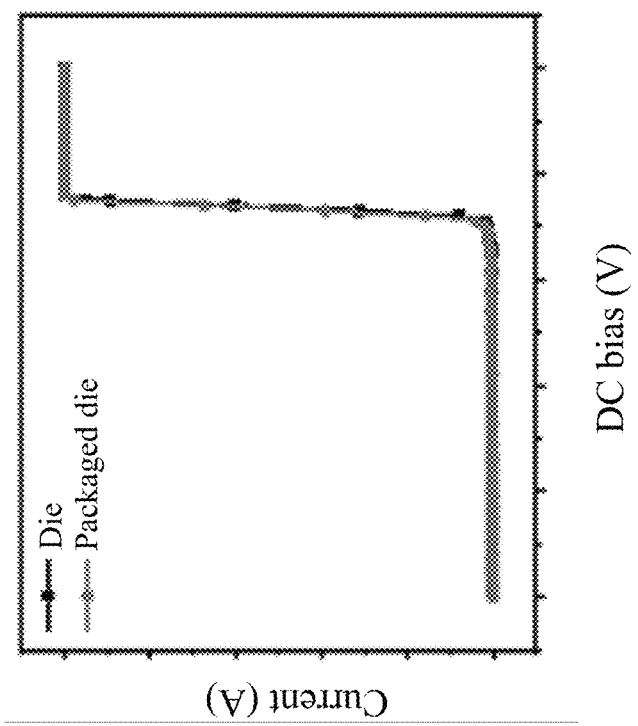
FIG. 9A show I-V curves of a bare die and the packaged die of FIG. 8E according to some embodiments of the present disclosure.

FIG. 9A show I-V curves of a bare die and the packaged die of FIG. 8E according to some embodiments of the present disclosure. In FIG. 9A, the horizontal axis represents DC voltage, and the vertical axis represents currents. It is evidenced from FIG. 9A that I-V curves of the bare die and the packaged die of FIG. 8E are substantially the same. This indicate that the graphene-based composite material 130' (referring to FIG. 8E) does not adversely influence circuit function of die because the operation/working voltage of the die is lower than the threshold voltage of the graphene-based composite material 130'.

FIG. 9B show I-V curves of the bare die and the packaged die of FIG. 8E with current in log scale according to some embodiments of the present disclosure. In FIG. 9B, the horizontal axis represents DC voltage, and the vertical axis represents currents in log scale. It is evidenced from FIG. 9A that the packaged die of FIG. 8E has a lower noise (e.g., current leakage) than the bare die when a small voltage bias (e.g., about 0.5V) is applied, as indicated by the arrow in FIG. 9B. This indicate that the graphene-based composite material 130' (referring to FIG. 8E) is advantageous for lowering the current leakages of dies.

Figure 9D:
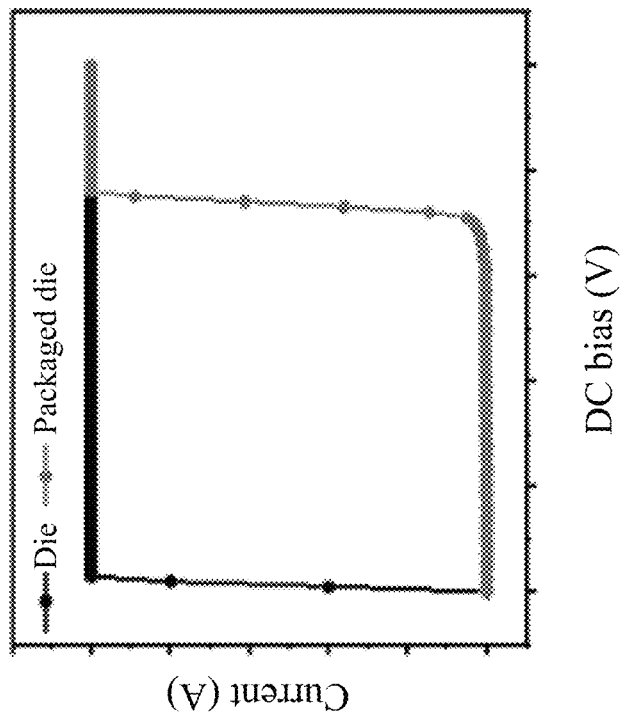
FIG. 9D show I-V curves of the bare die and the packaged die of FIG. 8E after TLP stressing according to some embodiments of the present disclosure.
Figure 9C:
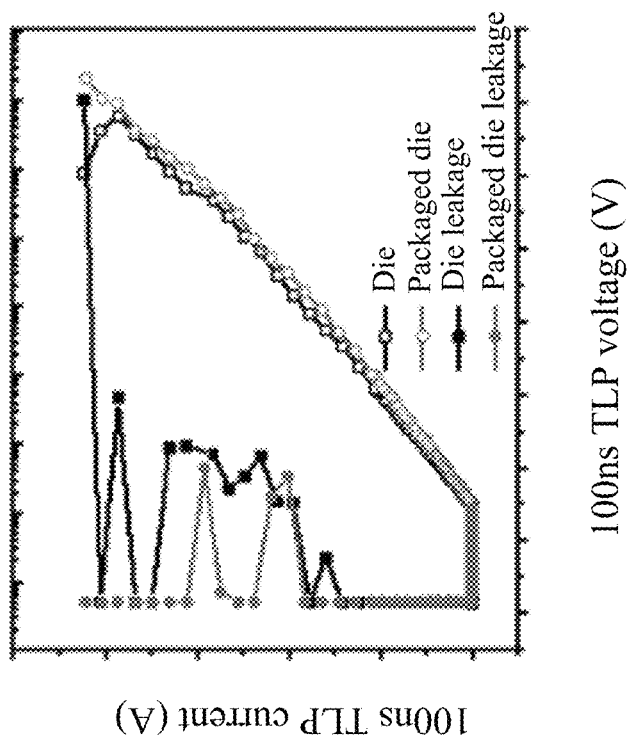
FIG. 9C is a graph illustrating TLP currents, TLP voltages, and leakage currents of the bare die and the packaged die of FIG. 8E under a TLP measurement according to some embodiments of the present disclosure.

FIG. 9C is a graph illustrating TLP currents, TLP voltages, and leakage currents of the bare die and the packaged die of FIG. 8E under a TLP measurement according to some embodiments of the present disclosure. In FIG. 9C, the vertical axis represents TLP currents, the bottom horizontal axis represents the TLP voltages, and the top horizontal axis represents the leakage currents. FIG. 9D show I-V curves of the bare die and the packaged die of FIG. 8E after TLP stressing according to some embodiments of the present disclosure. In FIG. 9D, the horizontal axis represents DC voltage, and the vertical axis represents currents. It is evidenced from FIGS. 9C and 9D that after TLP stressing, the bare die has occurred degradation and the packaged die is still working. It's noteworthy that the graphene-based composite material 130' (referring to FIG. 8E can significantly protect the die from pulse voltage, further lowering the leakage current of electrical properties.

Figure 10B:
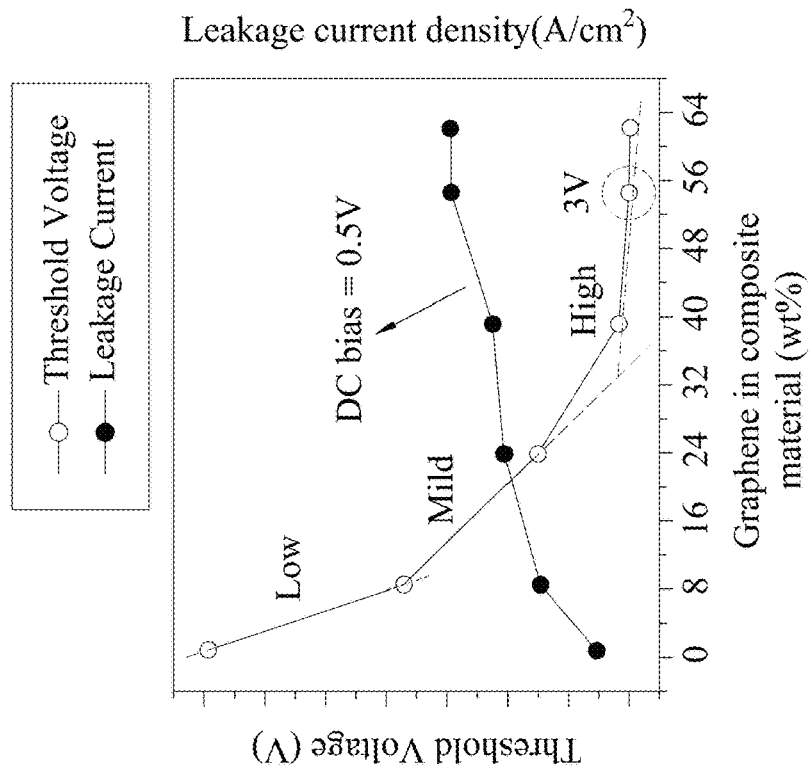
FIG. 10B is a graph illustrating threshold voltages and leakage current densities versus weight ratios of graphene in the composite materials according to some embodiments of the present disclosure.
Figure 10A:
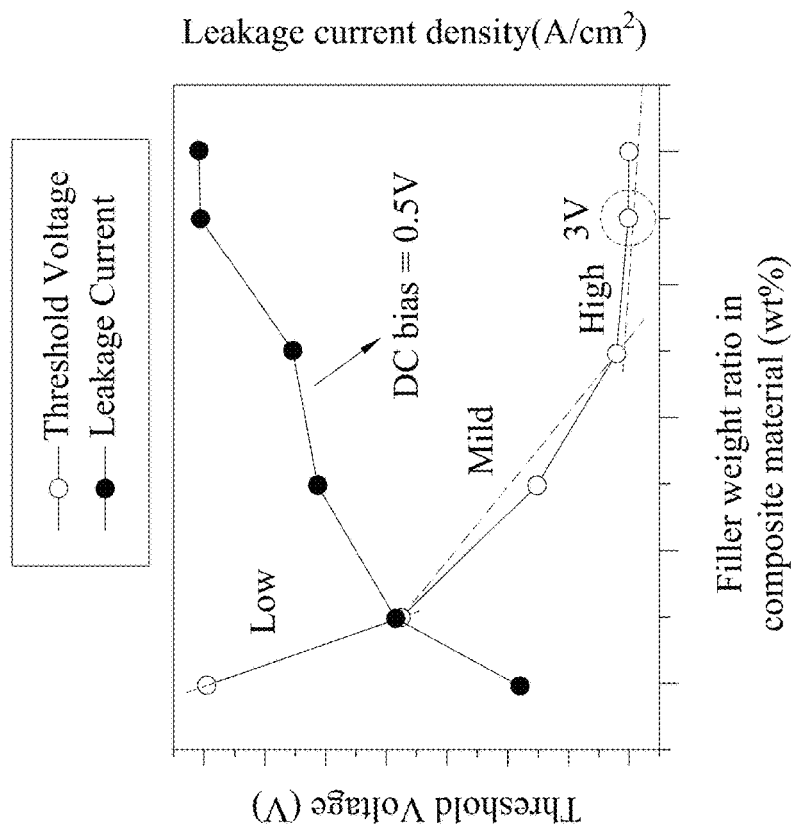
FIG. 10A is a graph illustrating threshold voltages and leakage current densities versus filler weight ratios of composite materials according to some embodiments of the present disclosure.

FIG. 10A is a graph illustrating threshold voltages and leakage current densities versus filler weight ratios of composite materials according to some embodiments of the present disclosure. In FIG. 10A, the horizontal axis represents a filler weight ratio in composite materials, the left vertical axis represents threshold voltage, and the right vertical axis represents leakage current density when a small voltage bias (e.g., about 0.5 Volts) is applied. The filler weight ratio may be designed to be in a range from about 5% to about 95%. For the composite materials with the filler weight ratio less below about 10%, the threshold voltage may be in a range from about 650 Volts to about 1200 Volts. For the composite materials with the filler weight ratio in a range from about 10% to about 50%, the threshold voltage may be in a range from about 20 Volts to about 650 Volts. For the composite materials with the graphene weight ratio in a range from about 50% to about 80%, the threshold voltage may be in a range from about 0 Volts to about 20 Volts. If the filler weight ratio is less than about 5%, the threshold voltage may be too high to provide ESD protection. If the filler weight ratio is greater than about 95%, the threshold voltage may be too low to provide ESD protection.

FIG. 10B is a graph illustrating threshold voltages and leakage current densities versus weight ratios of graphene in the composite materials according to some embodiments of the present disclosure. In FIG. 10B, the horizontal axis represents a weight ratio of graphene in composite materials, the left vertical axis represents threshold voltage, and the right vertical axis represents leakage current density. For the composite materials with the graphene weight ratio below about 8%, the threshold voltage may be in a range from about 650 Volts to about 1200 Volts. For the composite materials with the graphene weight ratio in a range from about 8% to about 40%, the threshold voltage may be in a range from about 20 Volts to about 650 Volts. For the composite materials with the graphene weight ratio in a range from about 40% to about 80%, the threshold voltage may be in a range from about 0 Volts to about 20 Volts. From FIG. 10B, the composite materials with the graphene weight ratio in a range from about 8% to about 85% (e.g., about 8% to about 80%, about 8% to about 64%, about 8% to about 56%, or about 8% to about 40%), have a suitable threshold voltage (Vth) and a low leakage current. If the graphene weight ratio is less than about 8%, the threshold voltage may be too high to provide ESD protection. If the graphene weight ratio is greater than about 80% or 85%, the threshold voltage may be too low to provide ESD protection.

Figure 11B:
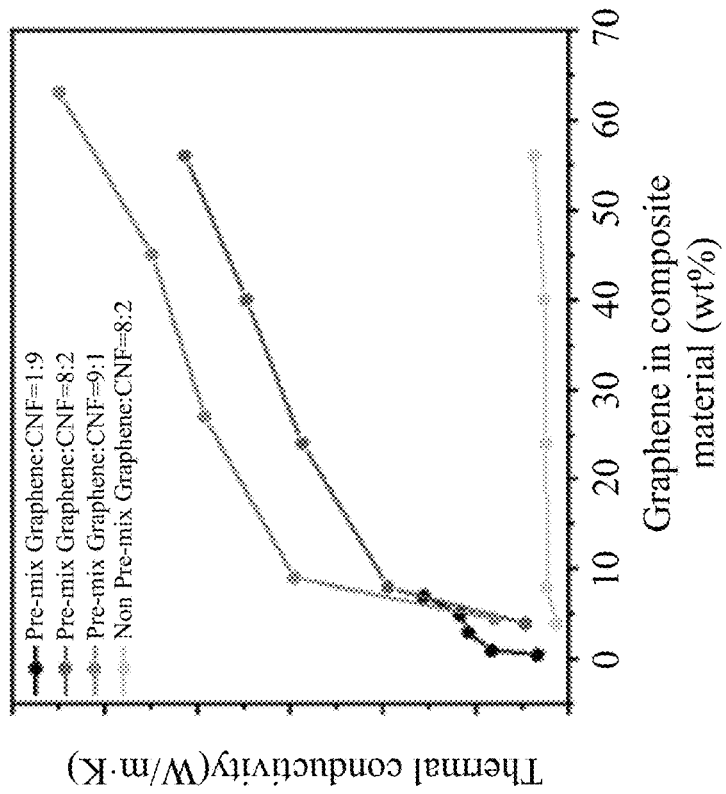
FIG. 11B is a graph illustrating thermal conductivities versus weight ratios of graphene in the composite materials according to some embodiments of the present disclosure.
Figure 11A:
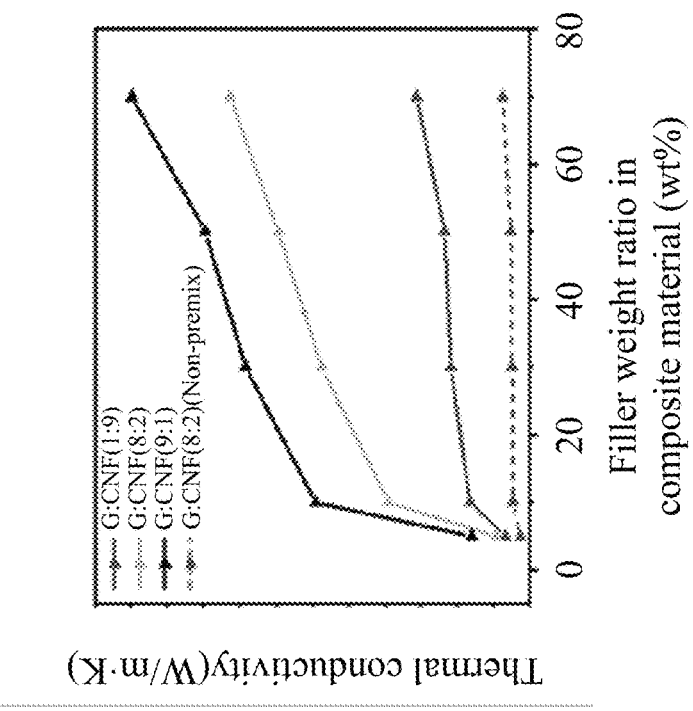
FIG. 11A is a graph illustrating thermal conductivities versus filler weight ratios of composite materials according to some embodiments of the present disclosure.

FIG. 11A is a graph illustrating thermal conductivities versus filler weight ratios of composite materials according to some embodiments of the present disclosure. In FIG. 11A, the horizontal axis represents a filler weight ratio in composite materials, and the vertical axis represents thermal conductivity. The filler weight ratio may be designed to be in a range from about 5% to about 95%. It is evidenced from FIG. 11A that the composite materials with the filler weight ratio greater than about 5% (or even greater than 7% or 10%) have a suitable thermal conductivity.

FIG. 11B is a graph illustrating thermal conductivities versus weight ratios of graphene in the composite materials according to some embodiments of the present disclosure. In FIG. 11B, the horizontal axis represents a weight ratio of graphene in composite materials, and the vertical axis represents thermal conductivity. For the composite materials with the graphene weight ratio below about 7%, the thermal conductivity may be below about 10 W/mK. For the composite materials with the graphene weight ratio in a range from about 7% to about 25%, the thermal conductivity may be in a range from about 10 W/mK to about 30 W/mK. For the composite materials with the graphene weight ratio above 25%, the thermal conductivity may be in a range from about 30 W/mK to about 54 W/mK. It is evidenced from FIG. 11B that the composite materials with the filler weight ratio greater than about 7% (or even greater 10%) have a suitable thermal conductivity (e.g., greater than about 10 W/mK). If the graphene weight ratio is less than about 7%, the thermal conductivity may be too low to provide heat dissipation. Furthermore, at the same graphene weight ratio (e.g., 10%, 25%, or 50%), the premixing ratio of the graphene materials 112' and the CNFs 118 at 9:1 shows greater thermal conductivity.

Figure 12B:
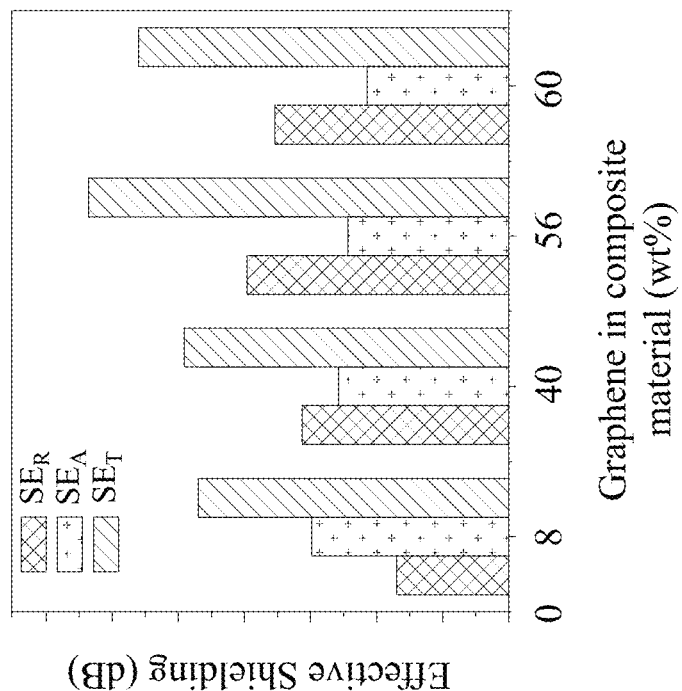
FIG. 12B is a graph illustrating effective shielding (dB) versus weight ratios of graphene in the composite materials according to some embodiments of the present disclosure.
Figure 12A:
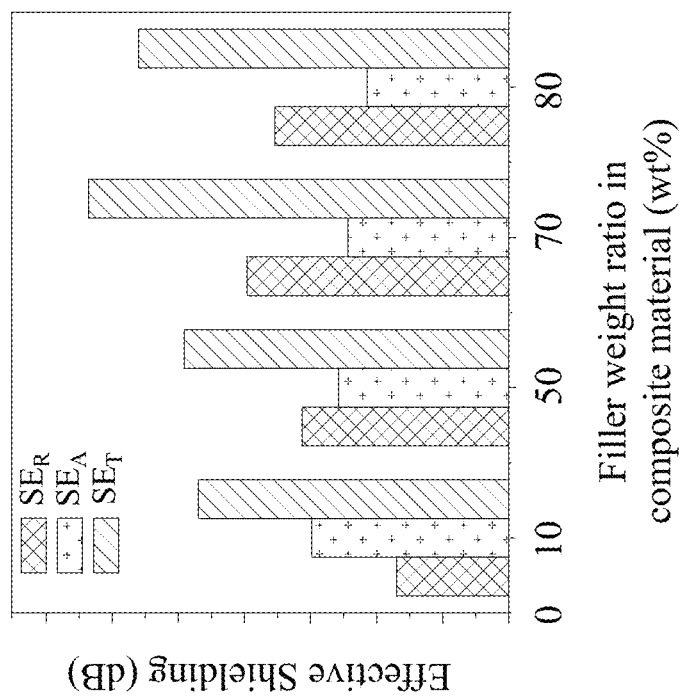
FIG. 12A is a graph illustrating effective shielding (dB) versus filler weight ratios of composite materials according to some embodiments of the present disclosure.

FIG. 12A is a graph illustrating effective shielding (dB) versus filler weight ratios of composite materials according to some embodiments of the present disclosure. In FIG. 12A, the horizontal axis represents a filler weight ratio in composite materials, and the vertical axis represents effective shielding. The filler weight ratio may be designed to be in a range from about 5% to about 95%.

FIG. 12B is a graph illustrating effective shielding (dB) versus weight ratios of graphene in the composite materials according to some embodiments of the present disclosure. In FIG. 12B, the horizontal axis represents a weight ratio of graphene in composite materials, and the vertical axis represents effective shielding. Crosstalk and interference of electromagnetic wave between devices or from outside world will affect the original signals. It is evidenced from FIGS. 12A and 12B that the composite materials reinforced by graphene, has a good effective shielding. The capability of effective shielding may vary with different ratio of composites material (graphene, CNFs, and polymer). The weight ratio of graphene may be designed to be in a range from about 8% to about 80%, and effective shielding is controlled in a range from about 23 dB to about 33 dB. The effective shielding may show best performance at about 60%. If the graphene weight ratio is greater than about 80% or less than about 8%, the effective shielding may degrade gradually.

With reference to FIGS. 10A, 11A, and 12A, for maintaining a suitable threshold voltage ($V_{th}$) and a low leakage current, a suitable thermal conductivity, and a suitable effective shielding, the filler weight ratio in the composite material 130' is designed to be in a range from about 5% to about 95%. With reference to FIGS. 10B, 11B, and 12B, for obtaining a suitable threshold voltage ($V_{th}$) and a low leakage current, a suitable thermal conductivity, and a suitable effective shielding, the weight ratio of graphene (e.g., graphene materials 112') in the composite material 130' is designed to be in a range from about 8% to about 85%. If the graphene weight ratio is too low (e.g., less than about 8%), the composite material 130' may not have a good thermal dissipation performance. If the graphene weight ratio is too high (e.g., greater than about 85%), the composite material 130' may not have a suitable threshold voltage for ESD protection and may have a poor EMI shielding ability.

Figure 13:
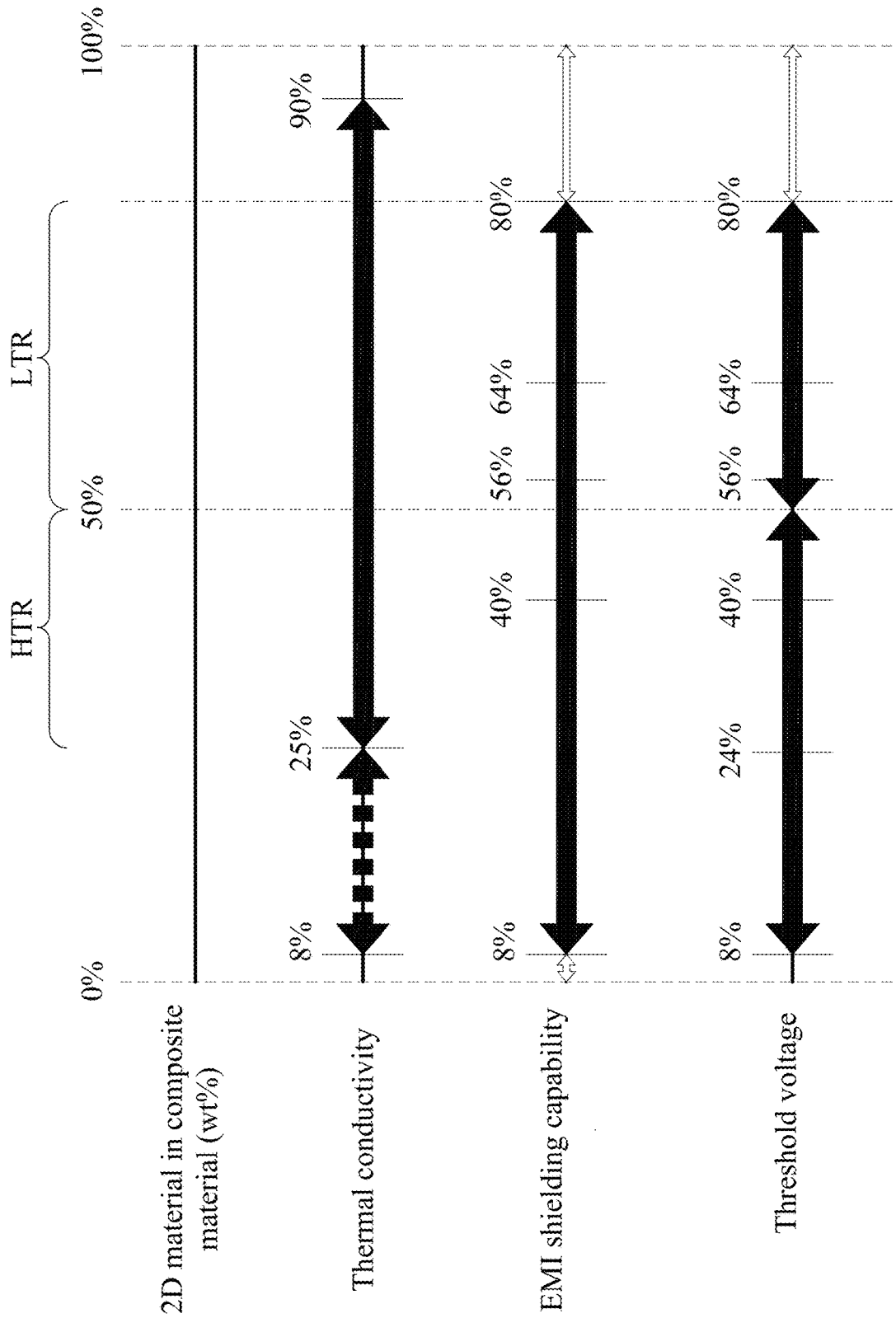
FIG. 13 is a graph illustrating various performances versus weight ratio of graphene in the composite material according to some embodiments of the present disclosure.

FIG. 13 is a graph illustrating various performances versus weight ratio of graphene in the composite material 130' according to some embodiments of the present disclosure. The horizontal axis represents weight ratios of graphene in the composite material 130' and double-sided arrows indicates the corresponding performances. The solid arrows indicate ranges with better/desired performance. The composite material 130' has a slowly increased thermal conductivity from about 25% to about 90%, while the dashed arrows indicate a range (e.g., from about 8% to about 25%) where thermal percolation occurs to initiate the formation of the three-dimensional network from the filler and the thermal conductivity increases drastically. The composite material 130' has a high EMI shielding ability from about 8% to about 80%, while the hollow arrows indicate ranges (e.g., from about 0% to about 8%, and from about 80% to about 100%) where the EMI shielding ability degrades gradually. The composite material 130' has a suitable threshold voltage for devices below about 80%, while the hollow arrows indicate ranges (e.g., higher than 80%) where the threshold voltage is very low, the composite material 130' is at normally-on state and may provide poor ESD performance.

In FIG. 13, to achieve the good performance of thermal conductivity, EMI shielding, and ESD, the range from about 25% to about 80% may be selected. For low power deices, to achieve the good performance of thermal conductivity, EMI shielding, and ESD, the range LTR from about 50% to about 80% may be selected. On the other hand, for high power devices, to achieve the good performance of thermal conductivity, EMI shielding, and ESD, the range HTR from about 25% to about 50% may be selected. In some other embodiments, depending on the required properties of the composite material 130', any suitable range may be selected for the composite material 130'. For example, to achieve the good performance of EMI shielding and ESD for high power devices (neglecting the performance of thermal conductivity), the range from about 8% to about 50% may be selected.

Figure 14:
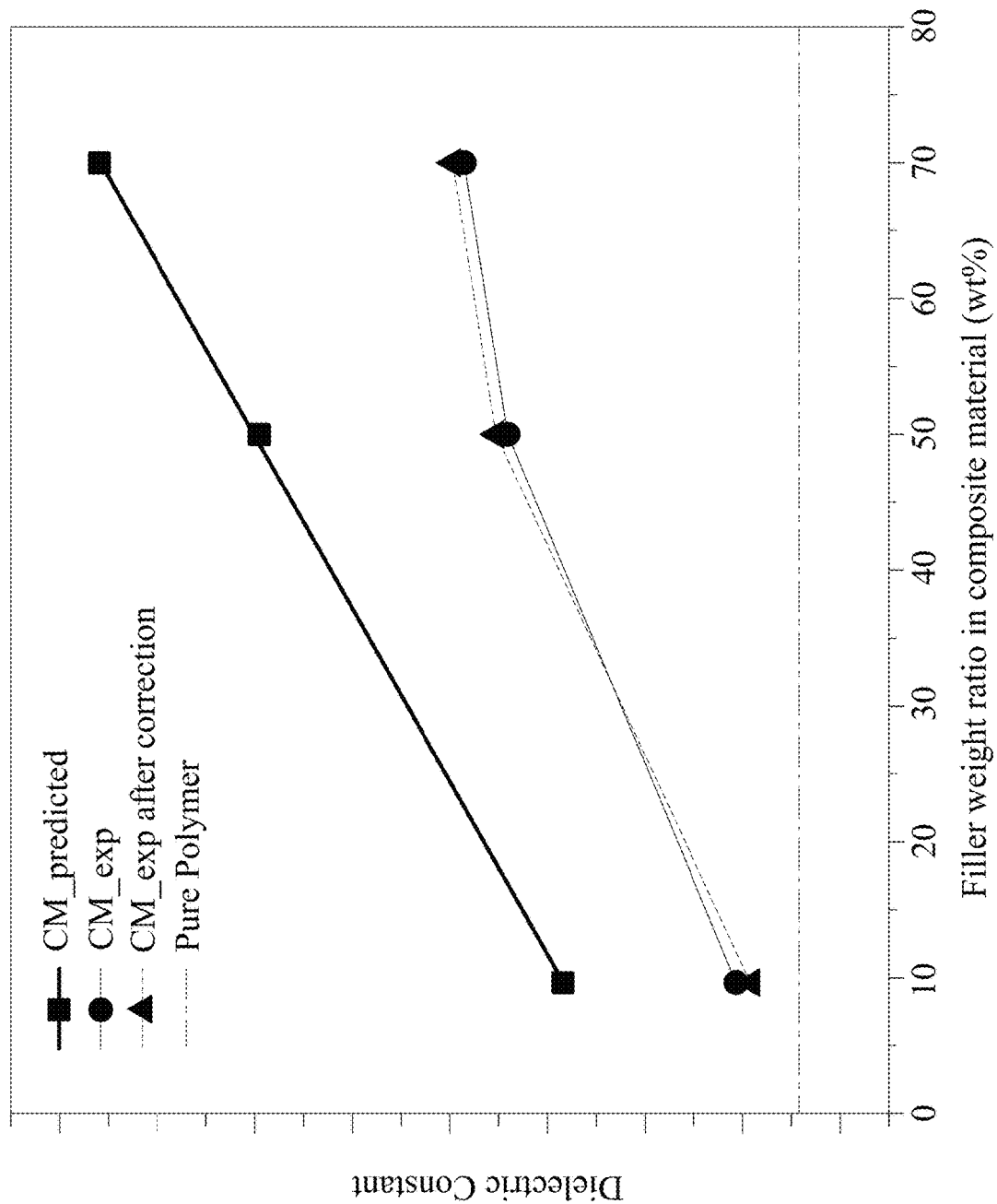
FIG. 14 is a graph illustrating dielectric constants versus filler weight ratios of composite materials according to some embodiments of the present disclosure.

FIG. 14 is a graph illustrating dielectric constants versus filler weight ratios of composite materials according to some embodiments of the present disclosure. The premixing weight ratio of the graphene and the CNF is about 8:2. The dielectric constant of the composite materials can be predicted by a Bruggeman model prediction (CM_predicted), measured by experiments (CM_exp), measured by experiments and then corrected by a parameter λ (CM_exp after correction). The dielectric constant of the pure polymer (PP) (e.g., the polymeric material 120a in FIG. 3A) is also indicated in FIG. 14. As shown in FIG. 14, by varying the filler weight ratio in the composite material, the dielectric constant of the composite material can be adjusted.

Figure 15:
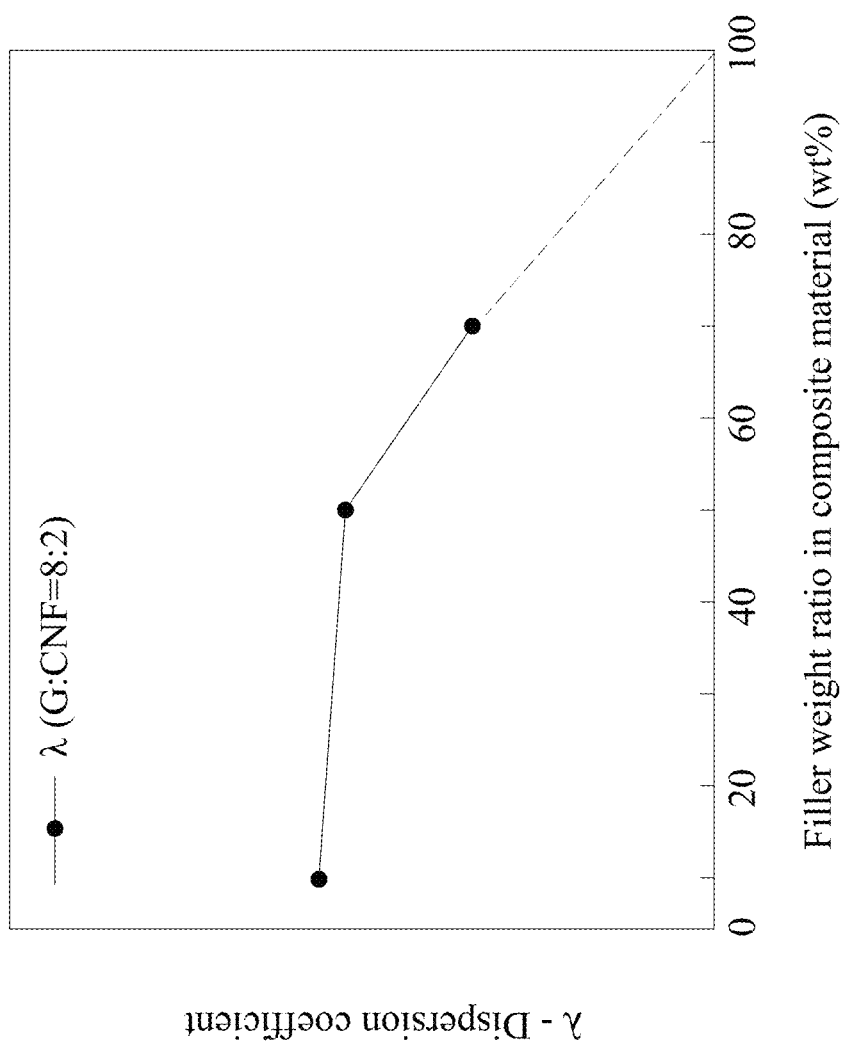
FIG. 15 is a graph illustrating λ versus filler weight ratio in PP according to some embodiments of the present disclosure.

FIG. 15 is a graph illustrating λ versus filler weight ratio in PP according to some embodiments of the present disclosure. In FIG. 15, the filler weight ratio in PP is shown on the horizontal axis, and the dielectric constant is shown on the vertical axis. The premixing weight ratio of the graphene and the CNF is about 8:2. In FIG. 15, λ may be used as an indicator of degrees of the in-plane distribution of the graphene in the composite material. Since the platelet of graphene has high aspect ratio and shows a highly anisotropic thermal property and anisotropic electrical property, the thermal conductivity and electrical property of the graphene filled composites would be strongly associated with the platelet orientation. In FIG. 15, the less λ indicates that the graphene are more in-plane distributed, while the greater λ indicates that the graphene are more out-of-plane distributed. For example, by increasing the filler weight ratio to 100%, λ is converged to theoretical zero, which indicates a graphene/CNF film has a high degree of in-plane distribution. In some embodiments, with a premixing weight ratio of graphene/CNF at 8:2 and a filler weight ratio at about 10%, the composite material 130' has a λ at about 0.572. In some embodiments, with a premixing weight ratio of graphene/CNF at 8:2 and a filler weight ratio at about 50%, the composite material 130' has a λ at about 0.526. In some embodiments, with a premixing weight ratio of graphene/CNF at 8:2 and a filler weight ratio at about 70%, the composite material 130' has a λ at about 0.357. In some embodiments, for using the composite material 130' for ESD (being an electrical insulator at a low bias voltage below threshold voltage and the electrical conductor at a higher bias voltage above the threshold voltage), the composite material 130' is designed with a λ in a range from about 0.3 to about 0.6. If λ is greater than 0.6, the graphene may be too out-of-plane distributed, which may result in poor heat dissipation. If λ is less than 0.6, the graphene may be too in-plane distributed, which may result in poor ESD performance. The parameter λ can be calculated by Bruddgeman model. The formulas of the Bruddgeman model can be represented as follows:

$$(V_{f1})\frac{\varepsilon_{f1} - \varepsilon_c}{\varepsilon_{f1} + 2\varepsilon_c} + (V_{f2})\frac{\varepsilon_{f2} - \varepsilon_c}{\varepsilon_{f2} + 2\varepsilon_c} + (V_{f3})\frac{\varepsilon_m - \varepsilon_c}{\varepsilon_m + 2\varepsilon_c} = 0$$

in which $V_{f1}$, $V_{f2}$, and $V_{f3}$ are volumes of each elements in the composite material 130', $\varepsilon_{f1}$, $\varepsilon_{f2}$, $\varepsilon_m$ are dielectric constants of each elements in the composite material 130', and $\varepsilon_c$ is the dielectric constant of the entire composite material 130'. For example, $V_{f1}$ is the volume of CNFs, $V_{f2}$ is the volume of graphene, and $V_{f3}$ is the volume of PP. For example, $\varepsilon_{f1}$ is the dielectric constant of CNFs, $\varepsilon_{f2}$ is the dielectric constant of graphene, and $\varepsilon_m$ is the dielectric constant of PP.

The dielectric constant of the composite material 130' can be described by the parameter λ as follows:

$$\langle \varepsilon \rangle = \frac{1}{3}(\lambda' \varepsilon_\perp + 2\lambda \varepsilon_\parallel)$$

in which <ε> is average dielectric constant, $\varepsilon_\perp$ is an out-of-plane dielectric constant, and $\varepsilon_\parallel$ is an in-plane dielectric constant, and λ' is equal to (1−λ).

Figure 16:
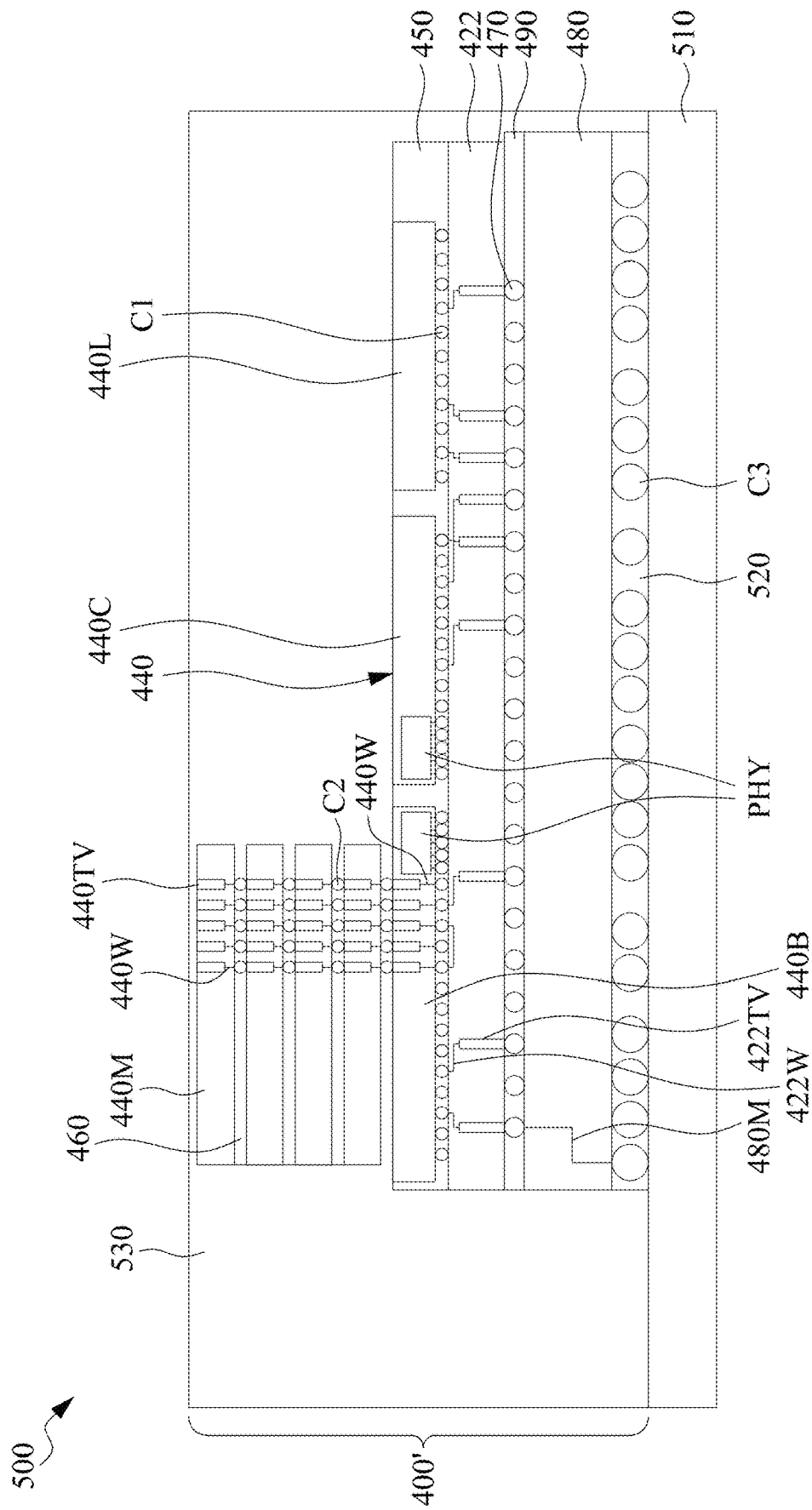
FIG. 16 shows a CoWoS package structure according to some embodiments of the present disclosure.

FIG. 16 shows a chip-on-wafer-on-substrate (CoWoS) package structure 500 according to some embodiments of the present disclosure. The package structure 500 may include a CoWoS semiconductor package device 400', a circuit board 510, and an encapsulant 530. The CoWoS semiconductor package device 400' may include various dies 440, an interposer 422, a package substrate 480, an encapsulant 450, and a underfill 490.

In some embodiments, the dies 440 may be bonded to the interposer 422 through the connectors C1. The die 440 may include conductive through vias 440TV extending through the main body of the die 440. The die 440 may further include conductive wires 440W in the RDL thereof, and the conductive wires 440W may connect the conductive through vias 440TV to the connectors C1/C2. The interposer 422 may include conductive through vias 422TV extending through the interposer 422. A RDL may be formed over interposer 422 and over the conductive through vias 422TV. The RDL may include conductive wires 422W connecting the conductive through vias 422TV to the connectors C1. The connectors 470 may connect the conductive through vias 422TV of the interposer 422 to a metallization pattern 480M of the package substrate 480. The connectors C3 may connect the metallization pattern 480M of the package substrate 480 to the circuit board 510. Through these connections, the dies 440 of the CoWoS semiconductor package device 400' can be electrically coupled to the circuit board 510.

In accordance with some exemplary embodiments, the dies 440 may include dies 440L, 440C, 440B, 440M. The die 440C may be a compute die, such as Central Processing Units (CPUs), Application processors (APs), system on chips (SOCs), Application Specific Integrated Circuits (ASICs), or the like. In accordance with some exemplary embodiments, the dies 440M comprise memory dies. The dies 440M may be Dynamic Random Access Memory (DRAM) dies, Static Random Access Memory (SRAM) dies, High-Bandwidth Memory (HBM) dies, Micro-Electro-Mechanical System (MEMS) dies, Hybrid Memory Cube (HMC) dies, or the like. The die 440L may be a logic die.

The die 440B may be a basic die where the memory dies 440M are stacked and bonded by connectors C2. The logic or base die is relatively simple and is built in a CMOS compute process to enable the efficient construction of drivers and of a small amount of logic to interface between the stack of memory dies 440M and the compute die 440C. Although four kinds of dies 440 are illustrated, fewer or more kinds of dies 440 may be used. The dies 440 may have an identical structure and/or identical functions, or may have different structures and functions. Some dies 440 (e.g., dies 440C and 440B) may include a physical layer/chip PHY which is closely associated with the physical connection between devices.

A underfill 460 may be disposed between the vertically stacked memory dies 440M. The encapsulant 450 may fill the gaps between dies 440B, 440C, 440L, and may be in contact with the connectors C1. A underfill 490 may be disposed between the interposer 420 and the package substrate 480 around the connectors 470. A underfill 520 may be disposed between the CoWoS semiconductor package device 400' and the circuit board 510 and around the connectors C3. The underfills 460, 490, and 520 may be formed by a capillary flow process after bonding, or may be formed by a suitable deposition method before bonding. In some embodiments, a curing process may be performed after a material of the underfill is dispensed to harden the material of the underfill. The CoWoS semiconductor package device 400' is bonded to the circuit board 510 through the connectors C3. Before or after the bonding process, the CoWoS semiconductor package device 400' may be encapsulated in the encapsulant 530.

In some embodiments, at least one of the underfills 460, 490, and 520 and the encapsulants 450 and 530 may include aforementioned composite material 130' (referring to FIG. 3A) fabricated through solvent replacement and the premixing process. For example, at least one of the underfills 460, 490, and 520 and the encapsulants 450 and 530 is formed by premixing CNFs and graphene to form a composite filler, compounding a prepolymeric material with the composite filler, and curing the mixture. In some embodiments, depending on the requirements of ESD, thermal conduction, electric shielding, and electrical isolation, at least two of the underfills 460, 490, and 520 and the encapsulants 450 and 530 may be designed to have different premixing weight ratios of CNF/graphene, different filler weight ratios, or different graphene ratios.

Based on the above discussions, it can be seen that the present disclosure offers advantages to the photonic package device. It is understood, however, that other embodiments may offer additional advantages, and not all advantages are necessarily disclosed herein, and that no particular advantage is required for all embodiments. One advantage is that by premixing CNFs and graphene to form a composite filler, a composite material reinforced by graphene can be created for ESD. Another advantage is that a threshold voltage of the composite material reinforced by graphene can be tuned by controlling a filler weight ratio and/or a premixing ratio, such that the composite material reinforced by graphene can serve as electrical insulator between dies. Still another advantage is that a solvent replacement process is performed for uniformly/homogeneously disperse graphene in a solvent.

According to some embodiments of the present disclosure, a method for fabricating a package structure includes premixing cellulose nanofibrils (CNFs) and a graphene material in a solvent to form a solution; removing the solvent from the solution to form a composite filler; mixing a prepolymeric material with the composite filler to form a composite material; and performing a molding process using the composite material.

According to some embodiments of the present disclosure, a method for fabricating a package structure includes dispersing a graphene material in a first solvent; replacing the first solvent with a second solvent to form a solution; adding a 1D nanomaterial into the solution, wherein the 1D nanomaterial has a higher length-to-width ratio than the graphene material; drying the solution to form a composite filler after adding the 1D nanomaterial; mixing a prepolymeric material with the composite filler to form a composite material; and encapsulating a die using the composite material.

According to some embodiments of the present disclosure, a package structure includes a die and an encapsulant surrounding the die. The encapsulant comprises a polymeric material, a network in the polymeric material. The network comprises 1D nanomaterial and a 2D material, the 1D nanomaterial has a higher length-to-width ratio than the 2D material. An in-plane electrical conductivity of the 2D material is greater than an electrical conductivity of the polymeric material, and a weight ratio of the 2D material in the encapsulant is in a range from about 8% to about 85%.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a package structure, comprising:
premixing cellulose nanofibrils (CNFs) and a graphene material in a solvent to form a solution;
removing the solvent from the solution to form a composite filler;
mixing a prepolymeric material with the composite filler to form a composite material; and
performing a molding process using the composite material.

2. The method of claim 1, further comprising:
dispersing a graphite powder in a first solvent; and
replacing the first solvent with a second solvent such that the graphene material is dispersed in the second solvent.

3. The method of claim 1, wherein removing the solvent from the solution comprises:
evaporating the solvent.

4. The method of claim 1, wherein removing the solvent from the solution is performed such that the composite filler is in solid form.

5. The method of claim 1, wherein performing the molding process comprises:
encapsulating a die using the composite material.

6. The method of claim 1, wherein the molding process is performed such that the CNFs and the graphene material form a network in the composite material.

7. A method for fabricating a package structure, comprising:
dispersing a graphene material in a first solvent;
replacing the first solvent with a second solvent to form a solution;
adding a 1D nanomaterial into the solution, wherein the 1D nanomaterial has a higher length-to-width ratio than the graphene material;
drying the solution to form a composite filler after adding the 1D nanomaterial;
mixing a prepolymeric material with the composite filler to form a composite material; and
encapsulating a die using the composite material.

8. The method of claim 7, wherein the second solvent have a higher hydrophilicity than the first solvent.

9. The method of claim 7, further comprising:
pulverizing the composite filler prior to mixing the prepolymeric material with the composite filler.

10. The method of claim 7, wherein adding the 1D nanomaterial into the solution is performed such that a weight ratio of the graphene material to the 1D nanomaterial is in a range from about 5:5 to about 9:1.

11. The method of claim 7, wherein mixing the prepolymeric material with the composite filler is performed such that a weight ratio of the graphene material to the composite material is in a range from about 25% to about 80%.

12. The method of claim 7, wherein the 1D nanomaterial comprises cellulose nanofibrils.

13. A package structure, comprising:
a die; and
an encapsulant surrounding the die, wherein the encapsulant comprises:
a polymeric material; and
a network in the polymeric material, wherein the network comprises 1D nanomaterial and a 2D material, the 1D nanomaterial has a higher length-to-width ratio than the 2D material, wherein an in-plane electrical conductivity of the 2D material is greater than an electrical conductivity of the polymeric material, and a weight ratio of the 2D material in the encapsulant is in a range from about 25% to about 80%.

14. The package structure of claim 13, wherein the weight ratio of the 2D material in the encapsulant is in a range from about 50% to about 80%.

15. The package structure of claim 13, wherein a weight ratio of the 2D material to the 1D nanomaterial is in a range from about 5:5 to about 9:1.

16. The package structure of claim 13, wherein the encapsulant has a first resistance under a first voltage and a second resistance under a second voltage, wherein the second voltage is greater than the first voltage, and the second resistance is less than the first resistance.

17. The package structure of claim 16, wherein the encapsulant has a threshold voltage between the first and second voltages, and the threshold voltage is higher than an operating voltage of the die, and the operating voltage of the die is in a range from about 0.6 Volts to about 1200 Volts.

18. The package structure of claim 16, wherein the encapsulant has a threshold voltage between the first and second voltages, and the threshold voltage is in a range from about 2 Volts to about 1400 Volts.

19. The package structure of claim 13, wherein the encapsulant has a thermal conductivity greater than about 10 W/mK.

20. The package structure of claim 13, wherein the 2D material comprises graphene.

* * * * *